US010294421B2

(12) United States Patent
Fan et al.

(10) Patent No.: US 10,294,421 B2
(45) Date of Patent: May 21, 2019

(54) CORE-SHELL QUANTUM DOTS AND METHOD OF SYNTHESIZING THEREOF

(71) Applicant: CHRISTIE DIGITAL SYSTEMS USA, INC., Cypress, CA (US)

(72) Inventors: Fengjia Fan, Toronto (CA); Oleksandr Voznyy, Thornhill (CA); Michael Adachi, Langley (CA); Randy Sabatini, Rochester, NY (US); Kristopher Bicanic, Richmond Hill (CA); Sjoerd Hoogland, Toronto (CA); Edward Sargent, Toronto (CA)

(73) Assignee: CHRISTIE DIGITAL SYSTEMS USA, INC., Cypress, CA (US)

( * ) Notice: Subject to any disclaimer, the term of this patent is extended or adjusted under 35 U.S.C. 154(b) by 0 days.

(21) Appl. No.: 15/689,856

(22) Filed: Aug. 29, 2017

(65) Prior Publication Data

US 2018/0100102 A1 Apr. 12, 2018

Related U.S. Application Data

(60) Provisional application No. 62/384,413, filed on Sep. 7, 2016.

(51) Int. Cl.

*C09K 11/88* (2006.01)
*H01S 5/0683* (2006.01)
*C09K 11/56* (2006.01)
*C09K 11/02* (2006.01)

(52) U.S. Cl.

CPC .......... *C09K 11/883* (2013.01); *C09K 11/025* (2013.01); *C09K 11/565* (2013.01); *H01S 5/0683* (2013.01)

(58) Field of Classification Search

CPC ... C09K 11/883; C09K 11/025; C09K 11/565; H01S 5/0683

See application file for complete search history.

(56) References Cited

U.S. PATENT DOCUMENTS

2009/0097507 A1* 4/2009 Zhu ......................... H01S 3/067 372/6
2009/0309105 A1* 12/2009 Letts ......................... C30B 7/10 257/76
2010/0028680 A1 2/2010 Halas et al.
2010/0197490 A1 8/2010 Adzic et al.

(Continued)

OTHER PUBLICATIONS

Talapin, D. V. et al. Highly Emissive Colloidal CdSe/CdS Heterostructures of Mixed Dimensionality. Nano Lett. 3, 1677-1681(2003).*

(Continued)

*Primary Examiner* — Armando Rodriguez
(74) *Attorney, Agent, or Firm* — Perry + Currier, Inc.

(57) ABSTRACT

There is provided a quantum dot comprising a core comprising a semiconductor and a shell substantially covering the core. The core has a first side and a second side opposite the first side. The core is disposed eccentrically inside the shell such that the shell is thinnest at the first side and thickest at the second side. Moreover, the shell has a thickness of greater than or equal to zero at the first side. The core and the shell have different respective lattice constants such that the shell exerts a straining force on the core. The straining force is configured to modify an excitonic fine structure of the core.

18 Claims, 20 Drawing Sheets

(56) References Cited

U.S. PATENT DOCUMENTS

2013/0115455 A1* 5/2013 Banin .................. C09K 11/025 428/375
2014/0252274 A1 9/2014 Masson et al.

OTHER PUBLICATIONS

Talapin, Dmitri V., et al. "Seeded growth of highly luminescent CdSe/CdS nanoheterostructures with rod and tetrapod morphologies." Nano letters 7.10 (2007):2951-2959.
Extended European Search Report, dated Jan. 26, 2018, by EPO, re European Patent Application No. 17189908.1.
Franceschetti, A., Fu, H., Wang, L. W. & Zunger, A. Many-Body Pseudopotential Theory of Excitons in InP and CdSe Quantum Dots. Phys. Rev. B 60, 1819-1829 (1999).
Kresse, G. & Hafner, J. Ab Initio Molecular Dynamics for Liquid Metals. Phys. Rev. B 47, 558-561 (1993).
Jancu, J.-M., Scholz, R., Beltram, F. & Bassani, F. Empirical SPDS* Tight-Binding Calculation for Cubic Semiconductors: General Method and Material Parameters. Phys. Rev. B 57, 6493-6507 (1998).
Kresse, G. & Joubert, D. From Ultrasoft Pseudopotentials to the Projector Augmented-Wave Method. Phys. Rev. B 59, 1758-1775 (1999).
VandeVondele, J. et al. QUICKSTEP: Fast and Accurate Density Functional Calculations Using a Mixed Gaussian and Plane Waves Approach. Comput. Phys. Commun. 167, 103-128 (2005).
Grim, J. Q. et al. Continuous-wave biexciton lasing at room temperature using solution-processed quantum wells. Nat. Nanotechnol. 9, 891-895 (2014).
Ithurria, S. & Talapin, D. V. Colloidal Atomic Layer Deposition (c-ALD) using Self-Limiting Reactions at Nanocrystal Surface Coupled to Phase Transfer between Polar and Nonpolar Media. J. Am. Chem. Soc. 134, 18585-18590 (2012).
Iyer, Veena Hariharan, Rekha Mahadevu, and Anshu Pandey. "Low threshold quantum dot lasers." The journal of physical chemistry letters 7.7 (2016): 1244-1248.
Perdew, J. P., Burke, K. & Emzerhof, M. Generalized Gradient Approximation Made Simple. Phys. Rev. Lett. 77, 3865-3868 (1996).
Klimov, V. I. et al. Optical Gain and Stimulated Emission in Nanocrystal Quantum Dots. Science 290, 314-317 (2000).
Klimov, Victor I., et al. "Single-exciton optical gain in semiconductor nanocrystals." Nature 447.7143 (2007): 441.
Klimov, V. I. Multicarrier Interactions in Semiconductor Nanocrystals in Relation to the Phenomena of Auger Recombination and Carrier Multiplication. Annu. Rev. Condens. Matter. Phys. 5, 285-316 (2014).
Korkusinski, M., Zielinski, M. & Hawrylak, P. Multiexciton Complexes in InAs Self-Assembled Quantum Dots. J. Appl. Phys. 105, 122406 (2009).
McLellan, Luke Jonathan, et al. "CdS x Se 1-x/ZnS semiconductor nanocrystal laser with sub 10kW/cm 2 threshold and 40nJ emission output at 600 nm." Optics express 24.2 (2016): A146-A153.
Mahler, B., Nadal, B., Bouet, C., Patriarche, G. & Dubertret, B. Core/Shell Colloidal Semiconductor Nanoplatelets. J. Am. Chem. Soc. 134, 18591-18598 (2012).
Korkusinski, M., Voznyy, O. & Hawrylak, P. Fine Structure and Size Dependence of Exciton and Biexciton Optical Spectra in CdSe Nanocrystals. Phys. Rev. B 82, 245304 (2010).
Korkusinski, Marek, Oleksandr Voznyy, and Pawel Hawrylak. "Theory of highly excited semiconductor nanostructures including Auger coupling: Exciton-biexciton mixing in CdSe nanocrystals." Physical Review B 84.15 (2011): 155327.
Orfield, N. J., McBride, J. R., Keene, J. D., Davis, L. M. & Rosenthal, S. J. Correlation of Atomic Structure an Photoluminescence of the Same Quantum Dot: Pinpointing Surface and Internal Defects That Inhibit Photoluminescence. ACS Nano 9, 831-839 (2015).
Park, Y. S., Bae, W. K., Baker, T., Lim, J. & Klimov, V. I. Effect of Auger Recombination on Lasing in Heterostructured Quantum Dots with Engineered Core/Shell Interfaces. Nano Lett. 15, 7319-7328 (2015).
Efros, A. L. et al. Band-Edge Exciton in Quantum Dots of Semiconductors with a Degenerate Valence Band: Dark and Bright Exciton States. Phys. Rev. B 54, 4843-4856 (1996).
She, C. X. et al. Low-Threshold Stimulated Emission Using Colloidal Quantum Wells. Nano Lett. 14, 2772-2777 (2014).
Tessier, M. D., Javaux, C., Maksimovic, I., Loriette, V. & Dubertret, B. Spectroscopy of Single CdSe Nanoplatelets. ACS Nano 6, 6751-6758 (2012).
Tessier, M. D. et al. Spectroscopy of Colloidal Semiconductor Core/Shell Nanoplatelets with High Quantum Yield. Nano Lett. 13, 3321-3328 (2013).
Boykin, T. B., Klimeck, G., Bowen, R. C. & Oyafuso, F. Diagonal Parameter Shifts Due to Nearest-Neighbor Displacements in Empirical Tight-Binding Theory. Phys. Rev. B 66, 125207 (2002).
VandeVondele, J. & Hutter, J. Gaussian Basis Sets for Accurate Calculations on Molecular Systems in Gas and Condensed Phases. J. Chem. Phys. 127 1141105 (2007).
Veilleux, V. et al. Strain-Induced Effects in Colloidal Quantum Dots: Lifetime Measurements and Blinking Statistics. Nanotechnology 21, 134024 (2010).
Voznyy, O. Mobile Surface Traps in CdSe Nanocrystals with Carboxylic Acid Ligands. J. Phys. Chem. C 115, 15927-15932 (2011).
Voznyy, O. et al. A Charge-Orbital Balance Picture of Doping in Colloidal Quantum Dot Solids. ACS Nano 6, 8448-8455 (2012).
Yablonovitch, E. & Kane, E. O. Reduction of Lasing Threshold Current-Density by the Lowering of Valence Band Effective Mass. J. Lightwave Technol. 4, 504-506 (1986).
Li, Y. Y. H., Gong, X. G. & Wei, S. H. Ab Initio All-Electron Calculation of Absolute Volume Deformation Potentials of IV-IV, III-V, and II-VI Semiconductors: The Chemical Trends. Phys. Rev. B 73 (2006).
Yu, W. W., Qu, L. H., Guo, W. Z. & Peng, X. G. Experimental Determination of the Extinction Coefficient of CdTe, CdSe, and CdS Nanocrystals. Chem. Mater. 15, 2854-2860 (2003).
Yakunin, Sergii, et al. "Low-threshold amplified spontaneous emission and lasing from colloidal nanocrystals of caesium lead halide perovskites." Nature communications 6 (2015): 8056.
Javaux, C. et al. Thermal activation of non-radiative Auger recombination in charged colloidal nanocrystals. Nat. Nanotechnol. 8, 206-212 (2013).
Loken, C. et al. SciNet: Lessons Learned from Building a Power-efficient Top-20 System and Data Centre. J. Phys: Conf. Ser. 256, 012026 (2010).
Califano, M., Franceschetti, A. & Zunger, A. Temperature Dependence of Excitonic Radiative Decay in CdSe Quantum Dots:? The Role of Surface Hole Traps. Nano Lett. 5, 2360-2364 (2005).
Bera, Debasis, et al. "Quantum dots and their multimodal applications: a review." Materials 3.4 (2010): 2260-2345.
Adachi, M. M. et al. Microsecond-Sustained Lasing from Colloidal Quantum Dot Solids. Nat. Commun. 6, 8694 (2015).
Guilhabert, B., et al. "Nanosecond colloidal quantum dot lasers for sensing." Optics express 22.6 (2014): 7308-7319.
Beecher, A. N. et al. Atomic Structures and Gram Scale Synthesis of Three Tetrahedral Quantum Dots. J. Am. Chem. Soc. 136, 10645-10653 (2014).
Bernard, M. G. A. & Duraffourg, G. Laser Conditions in Semiconductors. Phys. Status Solidi B 1, 699-703 (1961).
Hartwigsen, C., Goedecker, S. & Hutter, J. Relativistic Separable Dual-Space Gaussian Pseudopotentials from H to Rn. Phys. Rev. B 58, 3641-3662 (1998).
Carbone, L. et al. Synthesis and Micrometer-Scale Assembly of Colloidal CdSe/CdS Nanorods Prepared by a Seeded Growth Approach. Nano Lett. 7, 2942-2950 (2007).
Cassette, E. et al. Colloidal CdSe/CdS Dot-in-Plate Nanocrystals with 2D-Polarized Emission. ACS Nano 6, 6741-6750 (2012).
Chen, O. et al. Compact High-Quality CdSe-CdS Core-Shell Nanocrystals with Narrow Emission Linewidths and Suppressed Blinking. Nat. Mater. 12, 445-451 (2013).

(56) References Cited

OTHER PUBLICATIONS

Choi, C. L., Koski, K. J., Sivasankar, S. & Alivisatos, A. P. Strain-Dependent Photoluminescence Behavior of CdSe/CdS Nanocrystals with Spherical, Linear, and Branched Topologies, Nano Lett. 9, 3544-3549 (2009).
Christodoulou, S. et al. Synthesis of Highly Luminescent Wurtzite CdSe/CdS Giant-Shell Nanocrystals Using a Fast Continuous Injection Route. J. Mater. Chem. C 2, 3439-3447 (2014).
Christodoulou, S. et al. "Band structure engineering via piezoelectric fields in strained anisotropic CdSe/CdS nanocrystals." Nature communications 6 (2015).
Coropceanu, I. & Bawendi, M. G. Core/Shell Quantum Dot Based Luminescent Solar Concentrators with Reduced Reabsorption and Enhanced Efficiency. Nano Let. 14, 4097-4101 (2014).
Cui, J. et al. Direct Probe of Spectral Inhomogeneity Reveals Synthetic Tunability of Single-Nanocrystal Spectral Linewidths. Nat. Chem. 5, 602-606 (2013).
Cui, J. et al. Evolution of the Single-Nanocrystal Photoluminescence Linewidth with Size and Shell: Implications for Exciton-Phonon Coupling and the Optimization of Spectral Linewidths. Nano Lett. 16, 289-296 (2016).
Dai, X. et al. Solution-Processed, High-Performance Light-Emitting Diodes Based on Quantum Dots. Nature 515, 96-99 (2014).
Dang, C. et al. Red, green and blue lasing enabled by single-exciton gain in colloidal quantum dot films. Nat. Nanotechnol. 7, 335-339 (2012).
EPO, Communication pursuant to Article 94(3) EPC, Dec. 17, 2018, re European Patent Application No. 17189908.1.

* cited by examiner

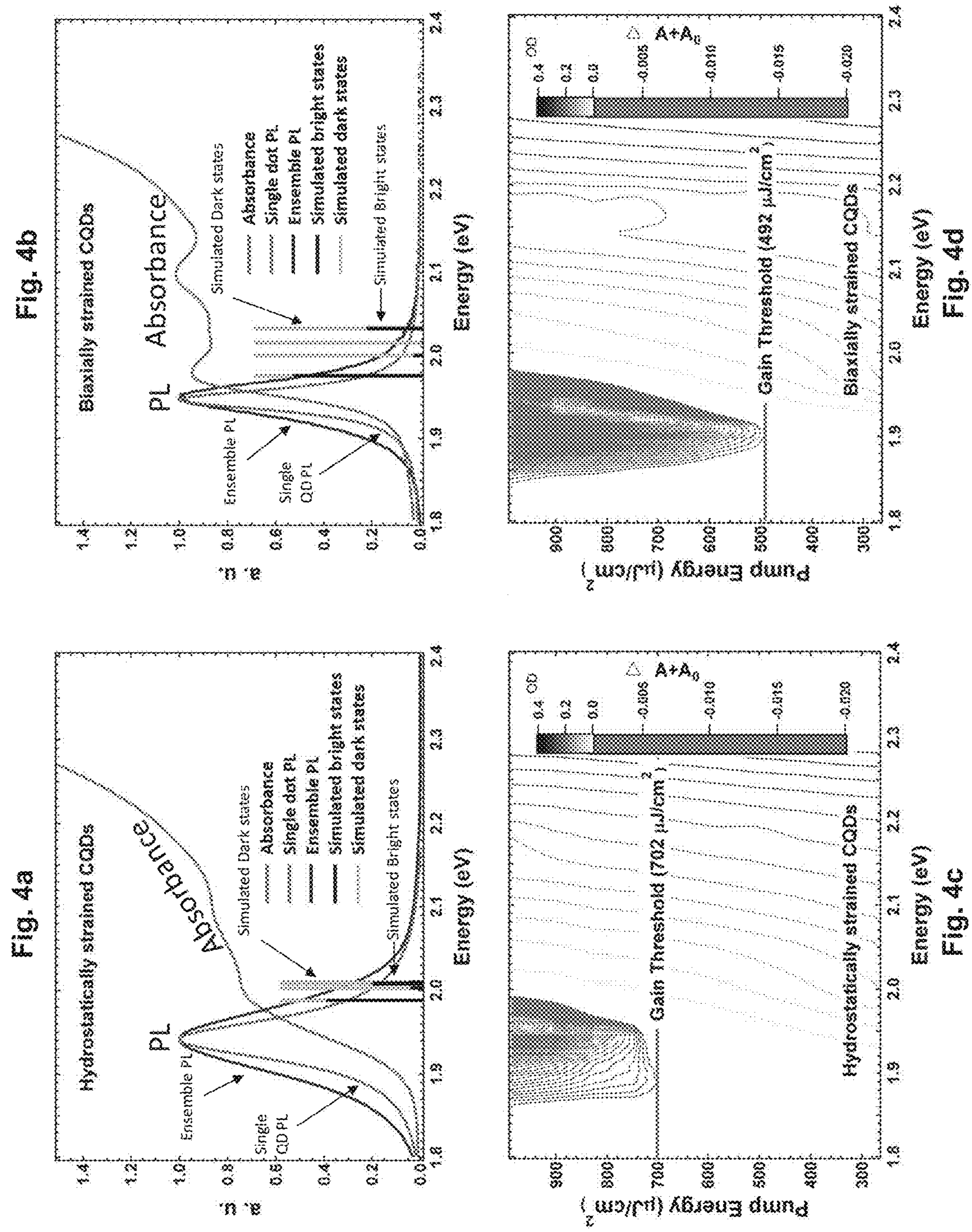
Fig. 4a
Hydrostatically strained CQDs
PL
Absorbance
Ensemble PL
Single QD PL
Simulated Dark states
Simulated Bright states
Absorbance
Single dot PL
Ensemble PL
Simulated bright states
Simulated dark states
a. u.
Energy (eV)
Fig. 4b
Biaxially strained CQDs
PL
Absorbance
Ensemble PL
Single QD PL
Simulated Dark states
Simulated Bright states
Absorbance
Single dot PL
Ensemble PL
Simulated bright states
Simulated dark states
a. u.
Energy (eV)
Fig. 4c
Gain Threshold (702 μJ/cm²)
Hydrostatically strained CQDs
Pump Energy (μJ/cm²)
Energy (eV)
A+A₀
OD
Fig. 4d
Gain Threshold (492 μJ/cm²)
Biaxially strained CQDs
Pump Energy (μJ/cm²)
Energy (eV)
A+A₀
OD Fig. 7a
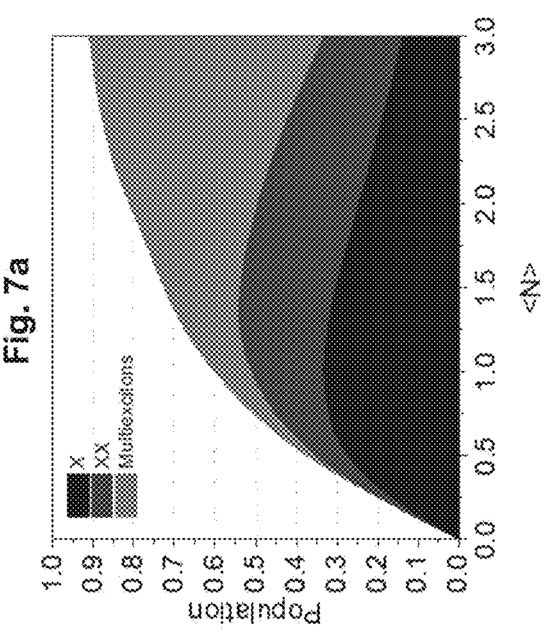
Fig. 7b
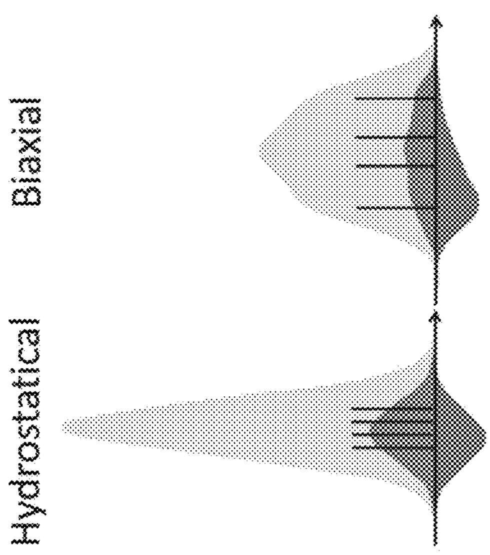
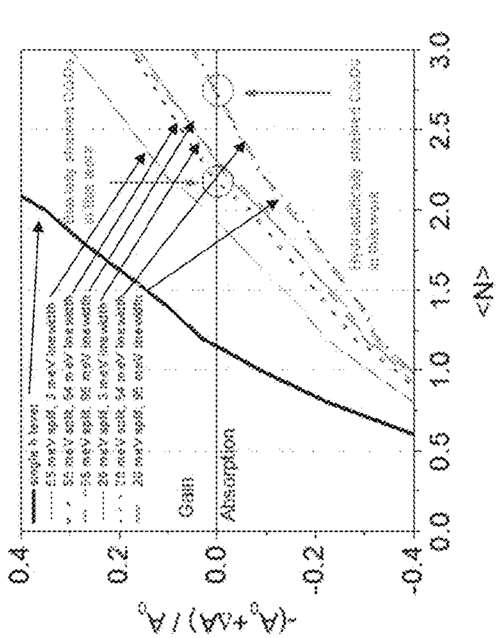
Fig. 7c
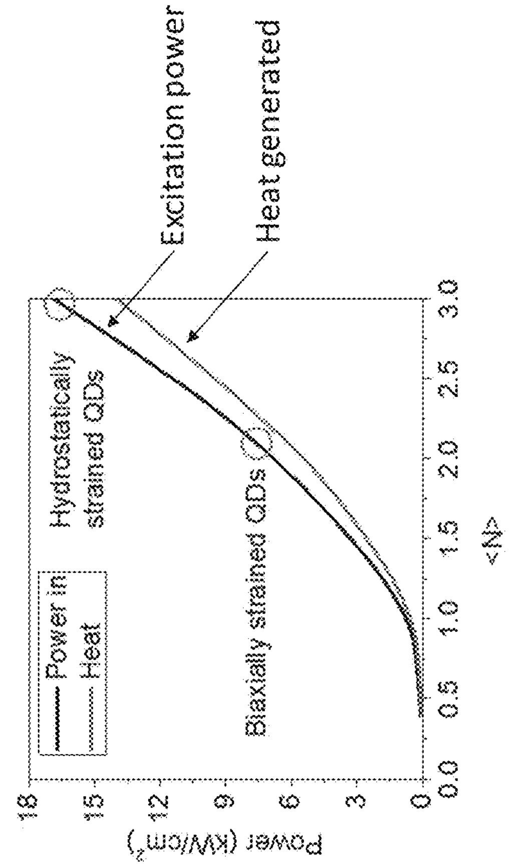
Fig. 7d

| CQDs with different shells | PLQY | PL decay single-exponential fit | ΔA decay bi-exponential fit | | | | |
|---|---|---|---|---|---|---|---|
| | | t | $t_1$ | $t_2$ | $A_1$ | $A_2$ | $A_1+A_2$ |
| After 1st shell growth | 25 % | 15.5 ns | 0.40 ns | 4.0 ns | 0.29 | 0.45 | 0.74 |
| After 2nd shell growth | 90% | 53.5 ns | 0.58 ns | 5.1 ns | 0.32 | 0.33 | 0.60 |

Fig. 9a
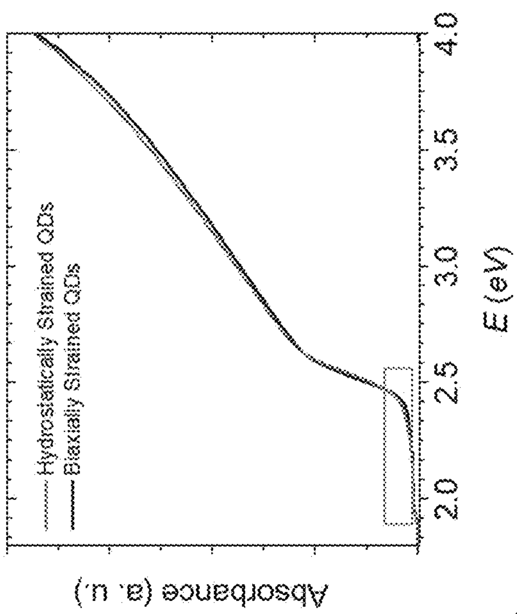
Fig. 9b
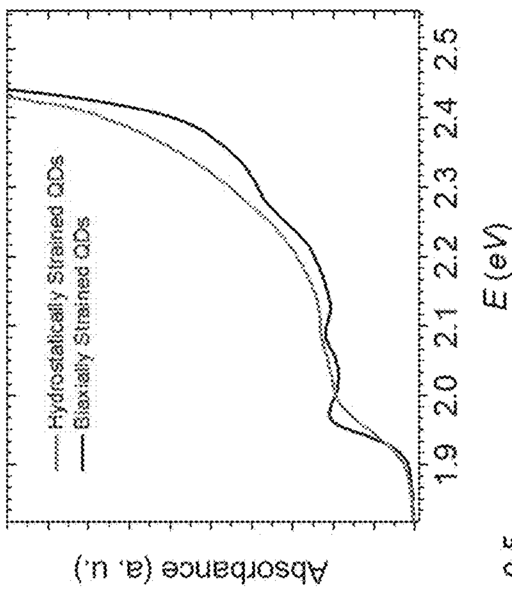
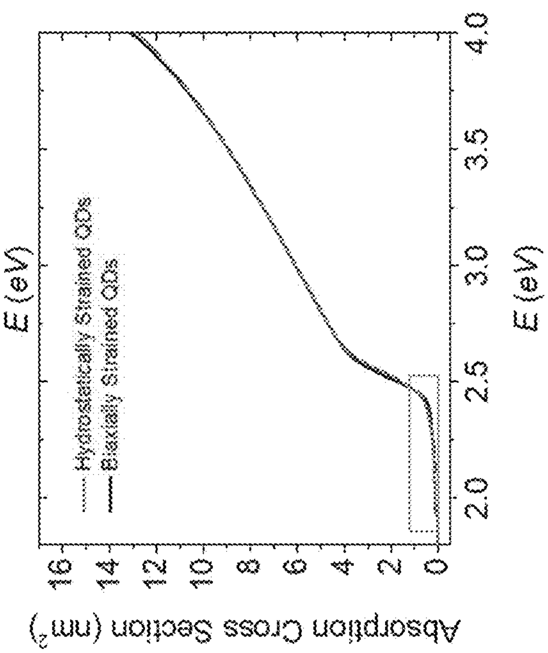
Fig. 9c
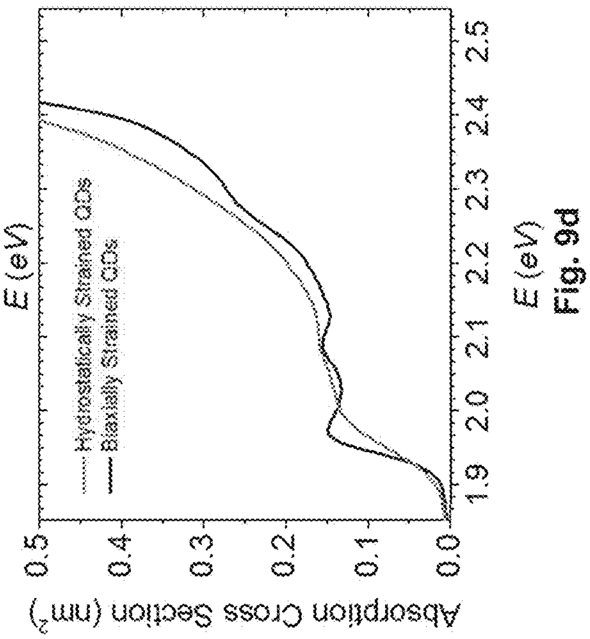
Fig. 9d

Fig. 10a
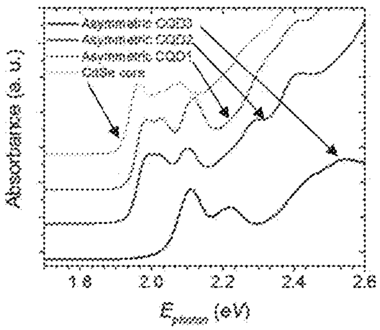
Fig. 10b
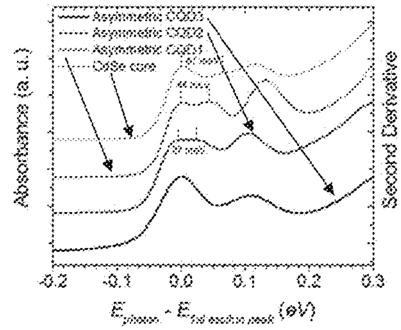
Fig. 10c
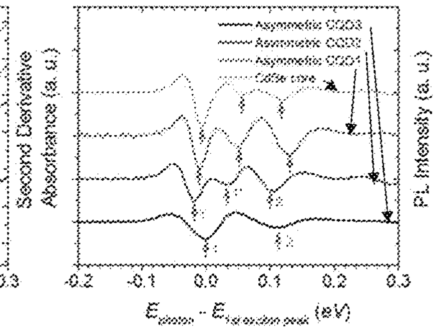
Fig. 10d
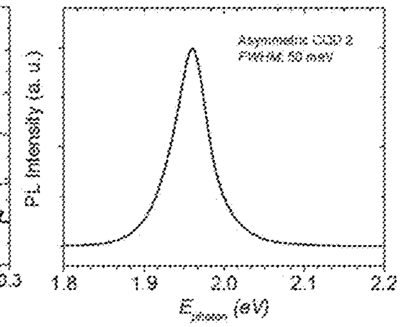
Fig. 10e
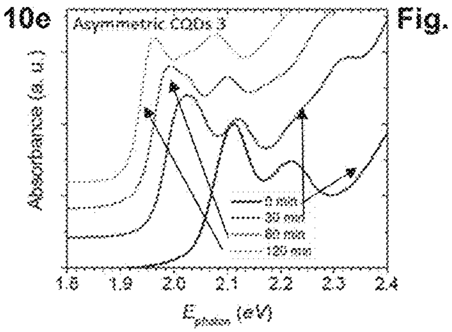
Fig. 10f
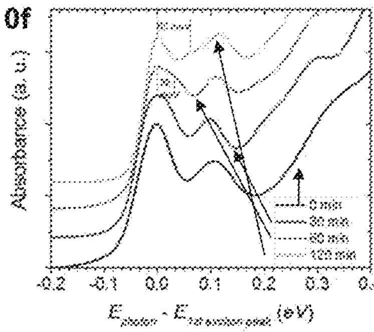
Fig. 10g
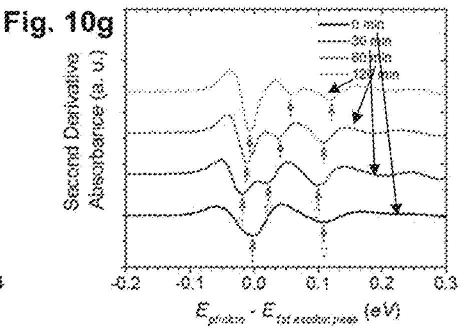
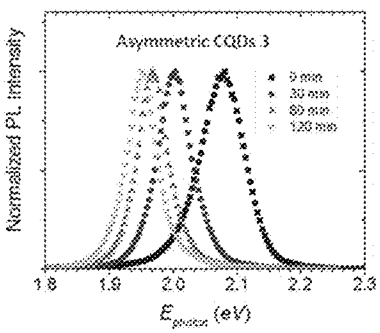
Fig. 10h
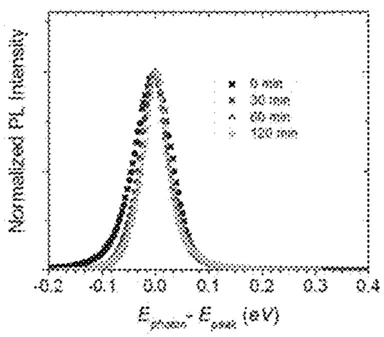
Fig. 10i
| CQD synthesized after different injection times | 1st exciton peak (eV) | PL peak (eV) | Stokes shift (meV) | PL *FWHM* (meV) |
|---|---|---|---|---|
| 0 min | 2.11 | 2.08 | 30 | 81 |
| 30 min | 2.02 | 2.00 | 19 | 61 |
| 60 min | 1.99 | 1.97 | 22 | 56 |
| 120 min | 1.96 | 1.95 | 12 | 56 |
Fig. 10j Fig. 11a
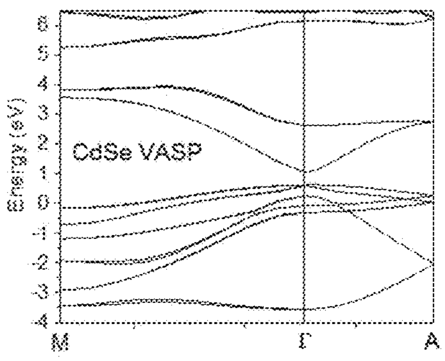
Fig. 11b
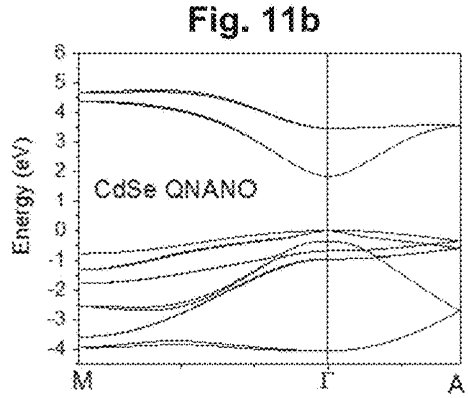
Fig. 11c
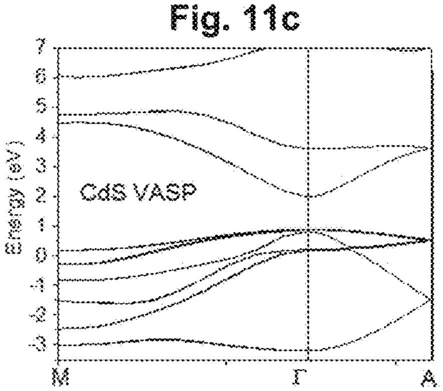
Fig. 11d
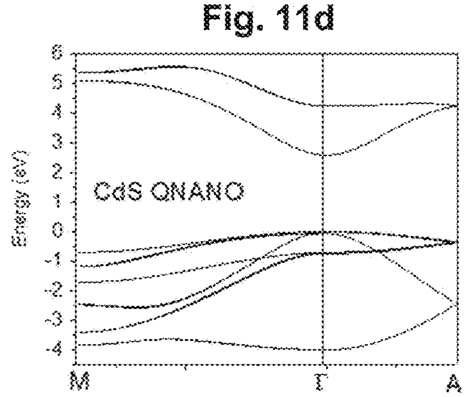
Fig. 11e
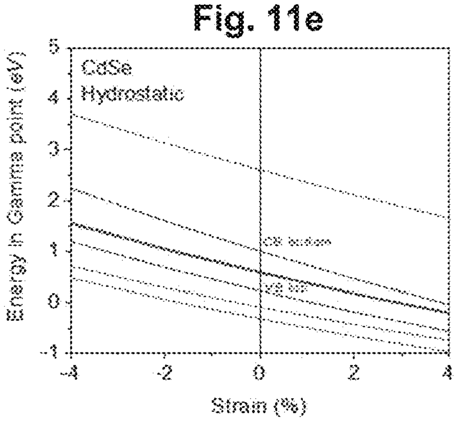
Fig. 11f
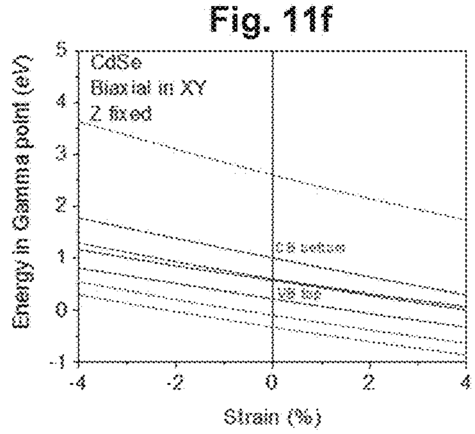
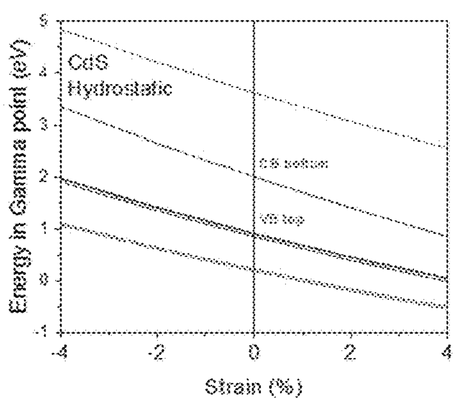
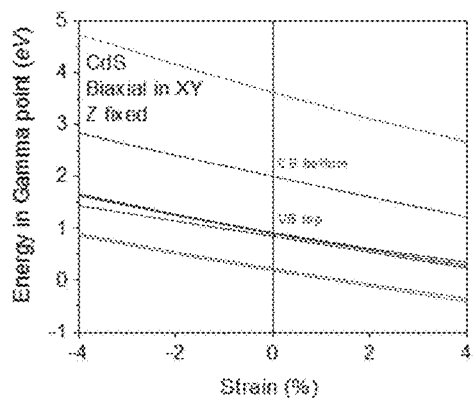
Fig. 11g
Fig. 11h Fig. 13b
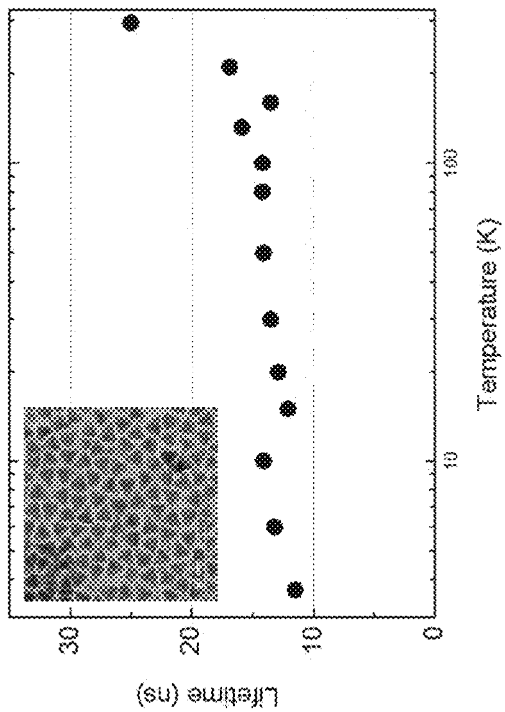
Fig. 13a
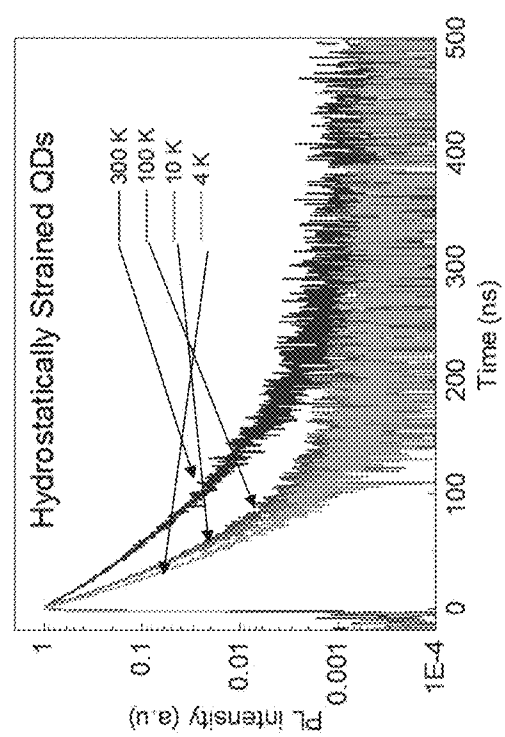
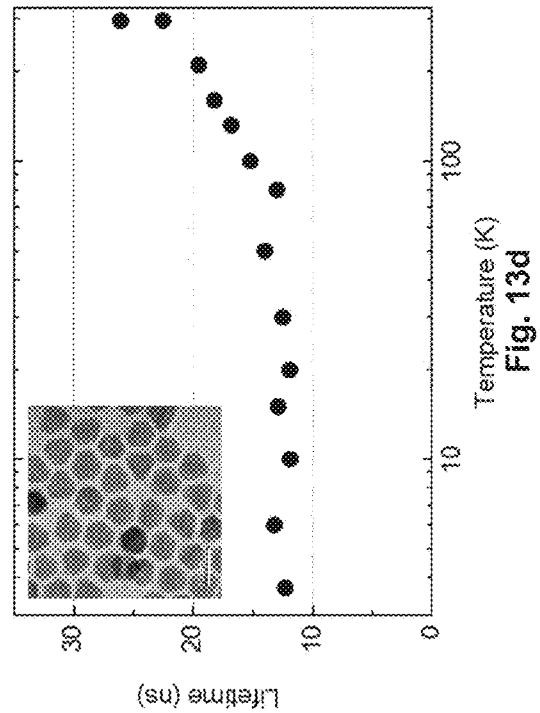
Fig. 13d
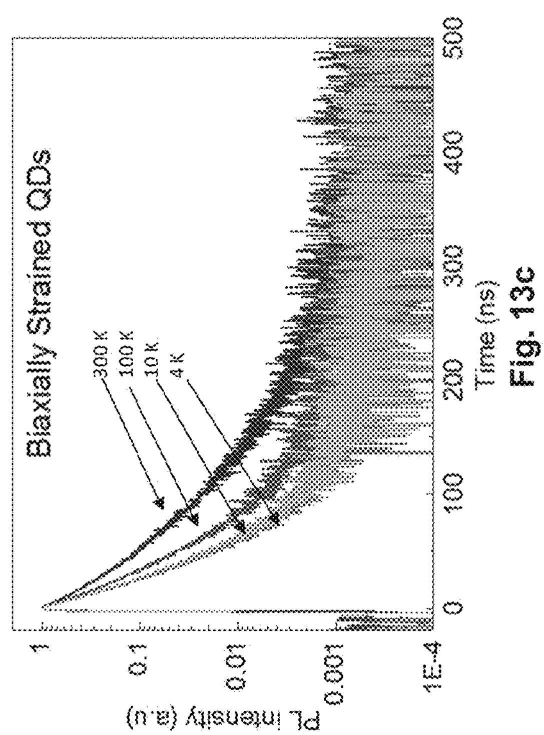
Fig. 13c

Fig. 18a
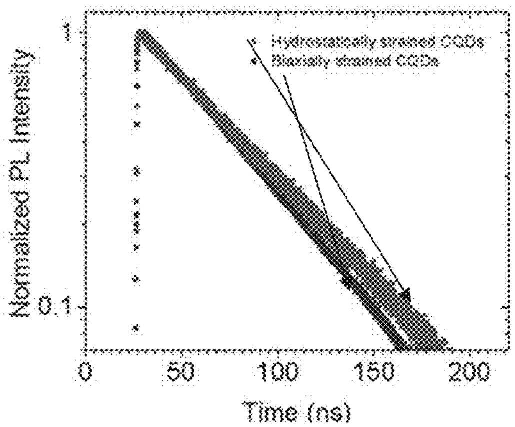
Fig. 18b
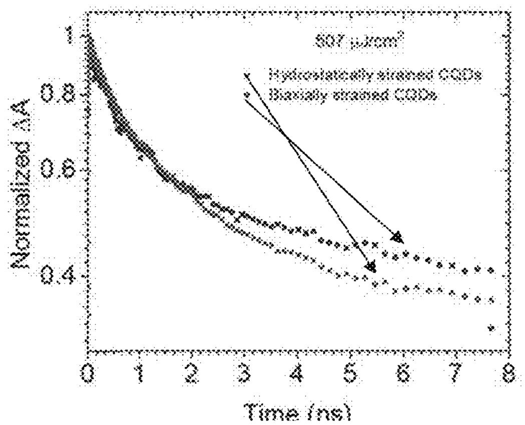
Fig. 18c
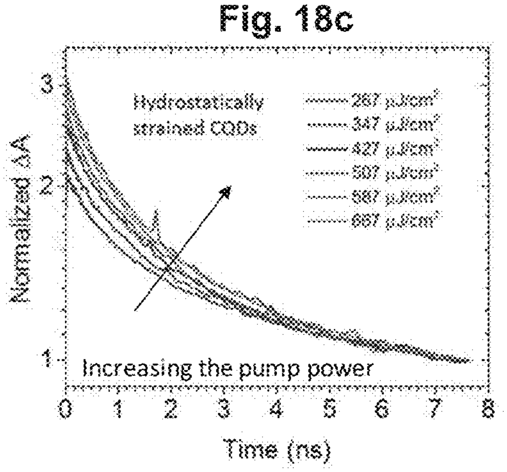
Fig. 18d
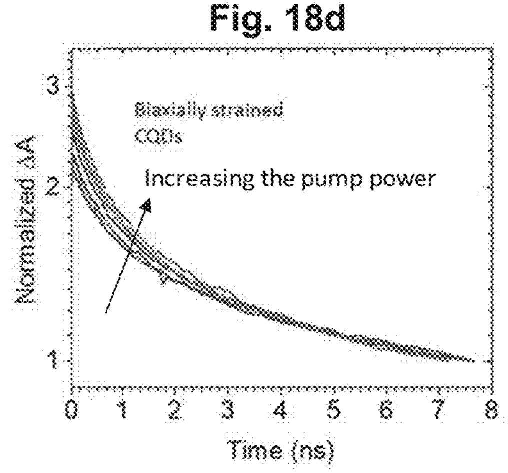
| CQDs with different shells | PL QY | PL decay single-exponential fit | ΔA decay bi-exponential fit | | | | |
|---|---|---|---|---|---|---|---|
| | | t | $t_1$ | $t_2$ | $A_1$ | $A_2$ | $A_1+A_2$ |
| Hydrostatically strained | 80% | 60.6 ns | 0.6 ns | 3.3 ns | 0.28 | 0.39 | 0.67 |
| Biaxially strained | 90% | 53.5 ns | 0.58 ns | 5.1 ns | 0.32 | 0.33 | 0.60 |
Fig. 18e

| Biaxially strained CQDs | ΔA decay bi-exponential fit | | | | |
|---|---|---|---|---|---|
| | $t_1$ | $t_2$ | $A_1$ | $A_2$ | $A_1+A_2$ |
| Before $Cl^-$ exchange | 0.68 ns | 3.1 ns | 0.29 | 0.31 | 0.60 |
| After $Cl^-$ exchange | 0.65 ns | 3.0 ns | 0.32 | 0.27 | 0.59 |

CORE-SHELL QUANTUM DOTS AND METHOD OF SYNTHESIZING THEREOF

CROSS-REFERENCE TO RELATED APPLICATION

This application claims priority from U.S. Provisional Patent Application No. 62/384,413, filed on Sep. 7, 2016, which is incorporated herein by reference in its entirety.

FIELD

The present specification relates to quantum dots, and in particular to core-shell quantum dots.

BACKGROUND

Quantum dots (QDs) can exhibit relatively narrow photoluminescence (PL) linewidths. However, often QDs have multiply-degenerate bandedge states where the energetic separation between these degenerate states is comparable to the thermal energy at room temperature. Excitons can therefore distribute over these multiple degenerate states, thereby decreasing the state filling of any one given state and broadening the PL linewidth even in the absence of significant inhomogeneity among an ensemble of the QDs.

SUMMARY

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, ZZ, and the like). Similar logic can be applied for two or more items in any occurrence of "at least one . . . " and "one or more . . . " language.

An aspect of the present specification provides a quantum dot comprising: a core comprising a semiconductor; a shell substantially covering the core; the core having a first side and a second side opposite the first side, the core disposed eccentrically inside the shell such that the shell is thinnest at the first side and thickest at the second side, the shell having a thickness of greater than or equal to zero at the first side; and the core and the shell having different respective lattice constants such that the shell exerts a straining force on the core, the straining force configured to modify an excitonic fine structure of the core.

The core can comprise CdSe and the shell can comprise CdS.

The core can comprise a wurtzite crystal structure and the first side can comprise a (0001) facet of the wurtzite crystal structure.

A thickness of the shell can be less than about 1 nm at the first side.

The straining force can comprise a biaxial force compressing the core in directions perpendicular to an axis running through the first side and the second side.

The shell can be substantially six-fold symmetrical about an axis running through the first side and the second side.

A thickness of the shell can be non-decreasing when moving along a surface of the core from the first side towards the second side.

A first excitonic absorption peak associated with the quantum dot can be split into a first modified peak having a first peak energy and a second modified peak having a second peak energy, the first peak energy separated from the second peak energy by more than a thermal energy at room temperature.

A first number of excitonic transitions corresponding to the first modified peak can be reduced compared to a second number of excitonic transitions corresponding to the first excitonic absorption peak.

The splitting the first excitonic absorption peak can comprise a reduction of an optical gain threshold of the quantum dot by at least about 1.1 times.

A photoluminescence linewidth of the quantum dot can be smaller than 40 meV.

The quantum dot can further comprise an additional shell having a substantially uniform thickness and can be configured to passivate the quantum dot to increase a photoluminescence quantum yield of the quantum dot.

The additional shell can comprise any one of CdS, ZnSe, and ZnS.

The quantum dot can be a colloidal quantum dot.

According to another aspect of the present specification a method is provided for synthesizing core-shell quantum dots, the method comprising: providing cores comprising CdSe particles dispersed in a liquid medium; mixing the cores with octadecene and oleylamine to form a reaction mixture; selectively removing the liquid medium from the reaction mixture; heating the reaction mixture to a range of about 280° C. to about 320° C.; and adding to the reaction mixture Cd-oleate and tri-octylphosphine sulphide to form a CdS shell on the cores.

The Cd-oleate and the tri-octylphosphine sulphide can be added simultaneously and continuously to the reaction mixture.

The method can further comprise growing an additional CdS shell on the core-shell quantum dots, the growing the additional CdS shell comprising: heating to a range of about 280° C. to about 320° C. another reaction mixture comprising the core-shell quantum dots; and after the heating, adding further Cd-oleate and octanethiol to the other reaction mixture as precursors for forming the additional CdS shell.

The further Cd-oleate and the octanethiol can be diluted in octadecene; and the further Cd-oleate and the octanethiol can be added simultaneously and continuously to the other reaction mixture.

The method can further comprise adding further oleylamine to the other reaction mixture, the further oleylamine configured to increase a dispersibility of the core-shell quantum dots.

According to yet another aspect of the present specification there is provided a laser comprising: an optical feedback structure; and a light emitter in optical communication with the optical feedback structure, the light emitter comprising the quantum dot comprising: a core comprising a semiconductor; a shell substantially covering the core; the core having a first side and a second side opposite the first side, the core disposed eccentrically inside the shell such that the shell is thinnest at the first side and thickest at the second side, the shell having a thickness of greater than or equal to zero at the first side; and the core and the shell having different respective lattice constants such that the shell exerts a straining force on the core, the straining force configured to modify an excitonic fine structure of the core. The modifying the excitonic fine structure of the core can be configured to reduce a gain threshold to facilitate lasing.

The laser can comprise a continuous wave laser.

The lasing can comprise continuous wave lasing.

BRIEF DESCRIPTION OF THE DRAWINGS

Some implementations of the present specification will now be described, by way of example only, with reference to the attached Figures, wherein:

FIGS. 4*a-d* show optical characterizations of CdSe—CdS core-shell QDs.

FIGS. 7*a-d* show numerical simulations related to QDs.

FIGS. 9*a-d* show full absorbance spectra and absorption cross section measurements for QDs.

FIGS. 10*a-j* show absorbance spectra, their second derivatives and PL spectra of QDs with varying degrees of splitting.

FIGS. 11*a-h* show band structure simulations for QDs.

FIGS. 13*a-d* show temperature dependent PL decay for QDs.

FIGS. 18*a-e* show single- and multiple-exciton lifetimes of hydrostatically and biaxially strained QDs, respectively.

DETAILED DESCRIPTION

Figure 1:
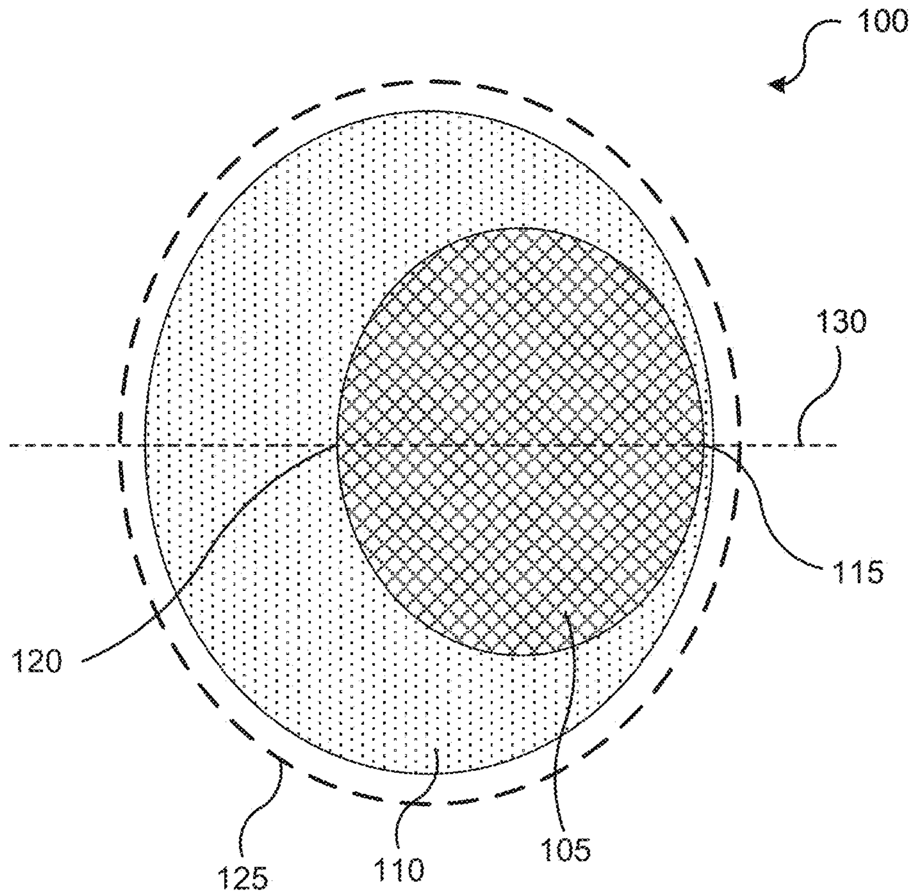
FIG. 1 shows a schematic, cross-sectional representation of a core-shell QD, according to non-limiting implementations.

To address the challenges posed by the degeneracy of bandedge states in QDs, core-shell QDs can be synthesized whereby a shell of variable thickness is formed on the core of each QD, which shell exerts a non-hydrostatic (i.e. non-isotropic) straining force on the core. This straining force, in turn, modifies the excitonic fine structure of the core to effectively increase the energetic separation between some of the degenerate states. FIG. 1 shows an example of such a core-shell structure. FIG. 1 depicts a schematic, cross-sectional representation of a QD 100 having a core 105 disposed eccentrically inside a shell 110 such that shell 110 has a variable thickness. Core 105 can comprise a semiconductor material.

Core 105 has a first side 115 and a second side 120 opposite first side 115. Shell 110 is thinnest at first side 115 and thickest at second side 120. The meaning of the word "side" used to describe first side 115 and second side 120 is not limited to the geometrical definition of "side" in the sense of a polygon or a polyhedron. "Side" can also encompass a point, a collection of points, a site, a portion, a region, and the like. In FIG. 1, first side 115 and second side 120 represent poles of a core 105 which, while shown in cross-section, would have an oblate spheroidal shape if depicted in perspective. "Side" can also encompass polar regions of core 105. In implementations where the core has a faceted shape, "side" can refer to all or a portion of a given facet. It is also contemplated that in some implementations one or both of the first side and the second side can each comprise more than one facet of a faceted core.

Core 105 and shell 110 have different respective lattice constants such that shell 110 exerts a straining force on core 105. This straining force can comprise a compressive force or an expansive force depending on the nature of the lattice mismatch between core 105 and shell 110. Generally, the thicker the shell 110 is, the larger this straining force will be. It should be noted that this relationship between shell thickness and the magnitude of the straining force can approach an asymptotic limit for very thick shells.

Because of the thickness profile of shell 110, the straining force exerted by shell 110 on core 105 is biaxial, as opposed to being hydrostatic. In other words, the straining force along axis 130 running through first side 115 and second side 120 is different than the straining force along directions perpendicular to axis 130. Such a biaxial straining force can modify the excitonic fine structure of core 105, for example by increasing the energetic separation between some of the degenerate states and/or excitonic transitions to be larger than the thermal energy at room temperature. In other words, such a biaxial straining force can lift, i.e. reduce, the effective degeneracy of the bandedge states at room temperature. Thermal energy can be calculated as the product of Boltzman's constant and temperature. Room temperature can comprise the ambient operating temperature and/or as a temperature in the range of about 22° C. to about 26° C.

Although in QD 100 shell 110 is thinnest at first side 115, it is contemplated that in other implementations the shell can be as thin at other points on the core as it is at the first side. In such other implementations the shell at the first side can still be described as thinnest as there are no points on the core where the shell is thinner than it is at the first side. Similarly, although in QD 100 shell 110 is thickest at second side 120, it is contemplated that in other implementations the shell can be as thick at other points on the core as it is at the second side. Similarly, in such other implementations the shell at the second side can still be described as thickest as there are no points on the core where the shell is thicker than it is at the second side. In some implementations, including in QD 100 shown in FIG. 1, the shell at the first side is thinner than the shell at the second side. Moreover, while FIG. 1 shows shell 110 having a non-zero thickness at first side 115, it is contemplated that in other implementations the shell can have a thickness equal to or greater than zero at the first side. In other words, in some implementations, the shell may not cover the core at all or a portion of the first side.

For example, in implementations where the core has a faceted shape and the first side comprises a facet of the core, the shell may have a zero thickness at the facet comprising the first side. In other words, the shell may not extend over the facet comprising the first side. Generally the shell substantially covers the core. In some implementations, substantially covering the core can comprise covering at least 50% of the surface area of the core. In other implementations, substantially covering the core can comprise covering at least 75% of the surface area of the core. In yet other implementations, substantially covering the core can comprise covering at least 85% of the surface area of the core. In yet other implementations, substantially covering the core can comprise covering at least 90% of the surface area of the core. Moreover, in yet other implementations, substantially covering the core can comprise covering at least 95% of the surface area of the core. In yet other implementations, substantially covering the core can comprise a covering all of the core. Furthermore, in yet other implementations, substantially covering the core can comprise covering all but at most one facet of the core.

As shown in FIG. 1, in QD 100 shell 110 has a variable thickness. Such a variable-thickness shell whose thickness gradually increases when moving along the surface of the core from the first side towards the second side can in turn allow for tailoring the profile of the biaxial straining force (e.g. achieving a gradual increase of straining force) along the surface of the core. Such a tailored straining force profile, in turn, can allow for finer and more tailored control of the modification of the excitonic fine structure of the core caused by the biaxial straining force. In some implementations, including in QD 100 shown in FIG. 1, the thickness of shell 110 can be non-decreasing when moving along the surface of core 105 from first side 115 towards second side 120.

While FIG. 1 shows oblately-shaped core 105 and shell 110, both with smoothly curving surfaces, it is contemplated that the core and the shell can have other suitable shapes. For example, in some implementations the core and/or the shell can have a faceted shape and/or surface. Moreover, in some implementations the core and/or the shell surfaces can have stepwise features, which steps can be at least one atomic layer in height.

Furthermore, while FIG. 1 shows a given shape and arrangement for core 105 and shell 110, it is contemplated that the core and the shell can have other suitable shapes or arrangements so long as the shell covers at least 50% of the surface area of the core, the core is eccentrically disposed inside the shell, and there exist two diametrically-opposite points on the surface of the core at the first of which points the shell is the thinnest and at the second of which points the shell is the thickest. Moreover, there is a lattice mismatch between the core and the shell materials, such that the shell thickness profile described above will exert a biaxial straining force on the core, which force will modify the excitonic fine structure of the core by lifting the degeneracy of the bandedge states.

By fine-tuning the degree of lattice mismatch and the thickness profile of the shell, the modification of excitonic fine structure of the core can be tailored such that a first excitonic absorption peak associated with the quantum dot is split into a first modified peak having a first peak energy and a second modified peak having a second peak energy, the first peak energy being separated from the second peak energy by more than a thermal energy at room temperature. Such a modification can also entail the number of excitonic transitions corresponding to the first modified peak being reduced compared to the number of excitonic transitions corresponding to the first excitonic absorption peak. In addition, such a modification can entail a reduction of the optical gain threshold of the quantum dot by at least about 1.1 times. In some implementations, the reduction of the optical gain threshold can be at least about 1.30 times. In yet other implementations, the reduction of the optical gain threshold can be at least about 1.43 times. These reductions in gain threshold are relative to a comparable hydrostatically strained core-shell QD where there is no lifting of degeneracy and splitting of excitonic absorption peaks due to biaxial straining forces.

The reduction in the optical gain threshold can facilitate the use of QDs described herein in fabricating lasers. In some implementations these lasers can comprise continuous-wave (CW) lasers. For example, such a laser can comprise an optical feedback structure and a light emitter in optical communication with the optical feedback structure. The light emitter can comprise the QDs described herein (e.g. QD 100 and/or QD 200 described below), whereby the modifying the excitonic fine structure of the core reduces the optical gain threshold to facilitate lasing. In some implementations the modifying the excitonic fine structure of the core reduces the optical gain threshold to facilitate continuous wave lasing. The optical feedback structure can comprise any suitable structure including, but not limited to a photonic crystal. The reduced optical gain threshold can allow the use of less energetic optical pumping, which in turn is less likely to cause the temperature of the QDs to surpass their thermal threshold and thereby damage the QDs, especially in the continuous-wave mode.

Turning again to FIG. 1, a second shell 125 is shown in a dashed line. Such second shell 125 can have a uniform or substantially uniform thickness, and can be used to passivate the surface of QD 100 to increase the PL quantum yield. In implementations where the shell does not cover the core at the first side (not shown in FIG. 1, but see FIG. 2), the second shell can provide the benefit of covering and passivating the portion of the core that is not covered by the first shell.

Figure 2A:
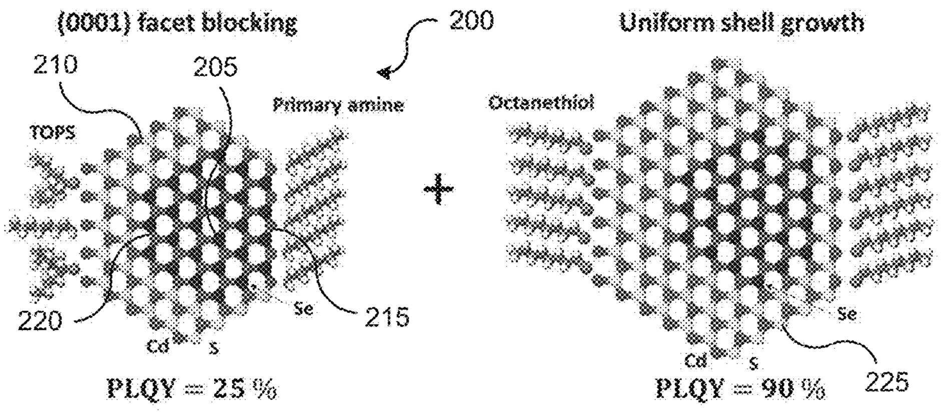
FIGS. 2*a-c* show a schematic, cross-sectional representation of another core-shell QD, and growth of asymmetric nanocrystals using facet-selective epitaxy, according to non-limiting implementations.

Turning now to FIG. 2*a* (left), a schematic, cross-sectional view of a QD 200 is shown where the atoms forming QD 200 are schematically depicted. FIG. 2*a* is a schematic depiction only, and the actual number and/or exact arrangement of atoms in QD 200 can be different than shown in FIG. 2*a*. QD 200 has a core 205 comprising CdSe with a wurtzite crystal structure. Core 205 has a first side 215 and a second side 220 opposite first side 215. First side 215 comprises facet (0001) of the wurtzite core 205. Core 205 is disposed eccentrically inside shell 210, which shell covers the surface of core 205 except at first side 215. Shell 210 is thinnest at first side 215 and thickest at second side 220. In some implementations, shell 210 being thickest at second side 220 can comprise shell 210 being as thick at points on shell 210 other than at second side 220 as shell 210 is thick at second side 220. Shell 210 at second side 220 is thicker than shell 210 at first side 215. The shell comprises CdS. The lattice mismatch between the CdSe core 205 and the CdS shell 210 cases shell 210 to exert a compressive straining force on core 205. Due to the thickness profile of shell 210, this straining force is bi-axial instead of being hydrostatic. In other words, the straining force exerted by shell 210 is different along a hypothetical axis passing through first side 215 and second side 220 than the straining force in directions perpendicular to this axis.

Figure 3:
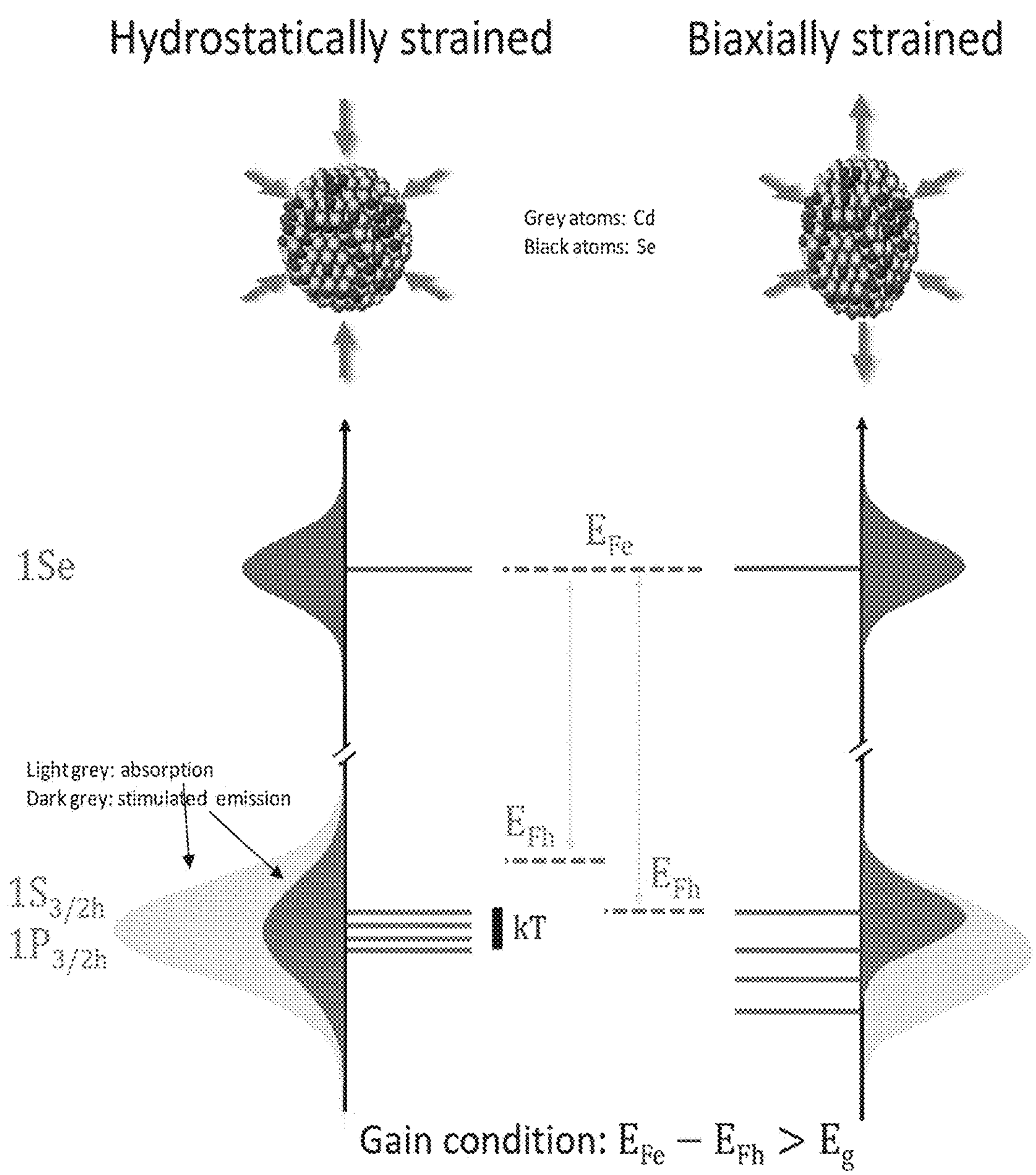
FIG. 3 shows schematically CdSe QD bandedge states, state filling and quasi-Fermi level splitting under hydrostatic and biaxial strain.

This biaxial straining force modifies the excitonic fine structure of core 205 by increasing the energetic separation between at least some of the degenerate bandedge states, as shown schematically in FIG. 3. This lifting of the effective degeneracy of the bandedge states, in turn, causes a first excitonic absorption peak associated with QD 200 to be split into a first modified peak having a first peak energy and a second modified peak having a second peak energy. Moreover, the first peak energy can be separated from the second peak energy by more than a thermal energy at room temperature. FIG. **4*b* shows the splitting of the first excitonic absorption peak caused by the biaxial strain created by shell 210**. Moreover, the number of excitonic transitions corresponding to the first modified peak is reduced compared to the number of excitonic transitions corresponding to the first excitonic absorption peak.

FIG. **2*a* (left) shows that the thickness of shell 210 grows gradually (from about one atomic layer to about two layers) when moving along the surface of core 205 from first side 215 towards second side 220. This gradual increase in thickness of shell 210 from first side 215 towards second side 220 can allow for tailoring the straining force profile exerted by shell 210 on core 205. This, in turn, can allow for controlling and tailoring the modification of the excitonic fine structure of core 205** caused by the straining force.

FIG. **2*a* (right) shows QD 200 with a uniform additional shell 225 covering QD 200. This additional shell comprises CdS and is about one atomic layer thick. Additional shell 225 covers and passivates QD 200, and in particular first side 215 which is not covered by shell 210, and as a result of this passivation can increase the PL quantum yield of QD 200**. It is contemplated that in some implementations, in addition to and/or instead of CdS, the additional shell can comprise any other suitable material including ZnSe, ZnS, and the like, and/or can have a thickness different than one atomic layer.

As shown in FIG. **2*a* (left), second side 220 has more Cd atoms and dangling bonds compared to first side 215. Due to this difference between the first and second sides, second side 220 would require a thicker passivating shell than first side 215. In QD 200, shell 210 already covers second side 220, thereby obviating the need for growing a further passivating shell on second side 220. This in turn can allow additional shell 225 used to passivate first side 215** to be fairly thin.

This relative thinness of additional shell 225 can reduce the magnitude of additional straining forces exerted by passivating additional shell 225 on QD 200. Reducing the additional straining forces in turn can reduce any interference from these additional forces with the straining force profile exerted on core 205 by shell 210. As such, because shell 210 covers second side 220 of core 205, which second side 220 would require a relatively thicker passivating shell, additional shell 225 can be relatively thinner thereby exerting a straining force on QD 200 that is relatively smaller and less likely to interfere with or significantly distort the straining force profile of shell 210 on core 205.

Due to the wurtzite crystal structure of core 205, shell 210 can be six-fold symmetrical about the hypothetical axis passing through first side 215 and second side 220 (axis not shown in FIG. 2, but analogous axis 130 is shown in FIG. 1). In implementations where the crystal structure and/or the materials used are different, the symmetry of the shell can also be different about the hypothetical axis. Moreover, while FIG. **2*a* shows shell 210 as not covering first side 215**, it is contemplated that in other implementations the shell can cover the first side and/or can have a thickness of less than about 1 nm at the first side. In yet other implementations, the shell can have a different thickness and/or thickness profile so long as the shell exerts a biaxial straining force on the core whereby the straining force along the hypothetical axis passing through the first and second sides is sufficiently different from the straining force in directions perpendicular to the axis such that the straining force can modify the excitonic fine structure resulting in splitting a first excitonic absorption peak associated with the QD into a first modified peak having a first peak energy and a second modified peak having a second peak energy, and the first peak energy being separated from the second peak energy by more than a thermal energy at room temperature. In some implementations, this splitting can occur at room temperature.

As discussed above, QD 200 can have an effective degeneracy of bandedge states that is reduced compared to an equivalent but hydrostatically-strained QD. This reduced degeneracy can contribute to QD 200 having a single-QD photoluminescence linewidth smaller than 40 meV. It is also contemplated that in some implementations, the single-QD photoluminescence linewidth can be smaller than or equal to 36 meV.

Figure 5:
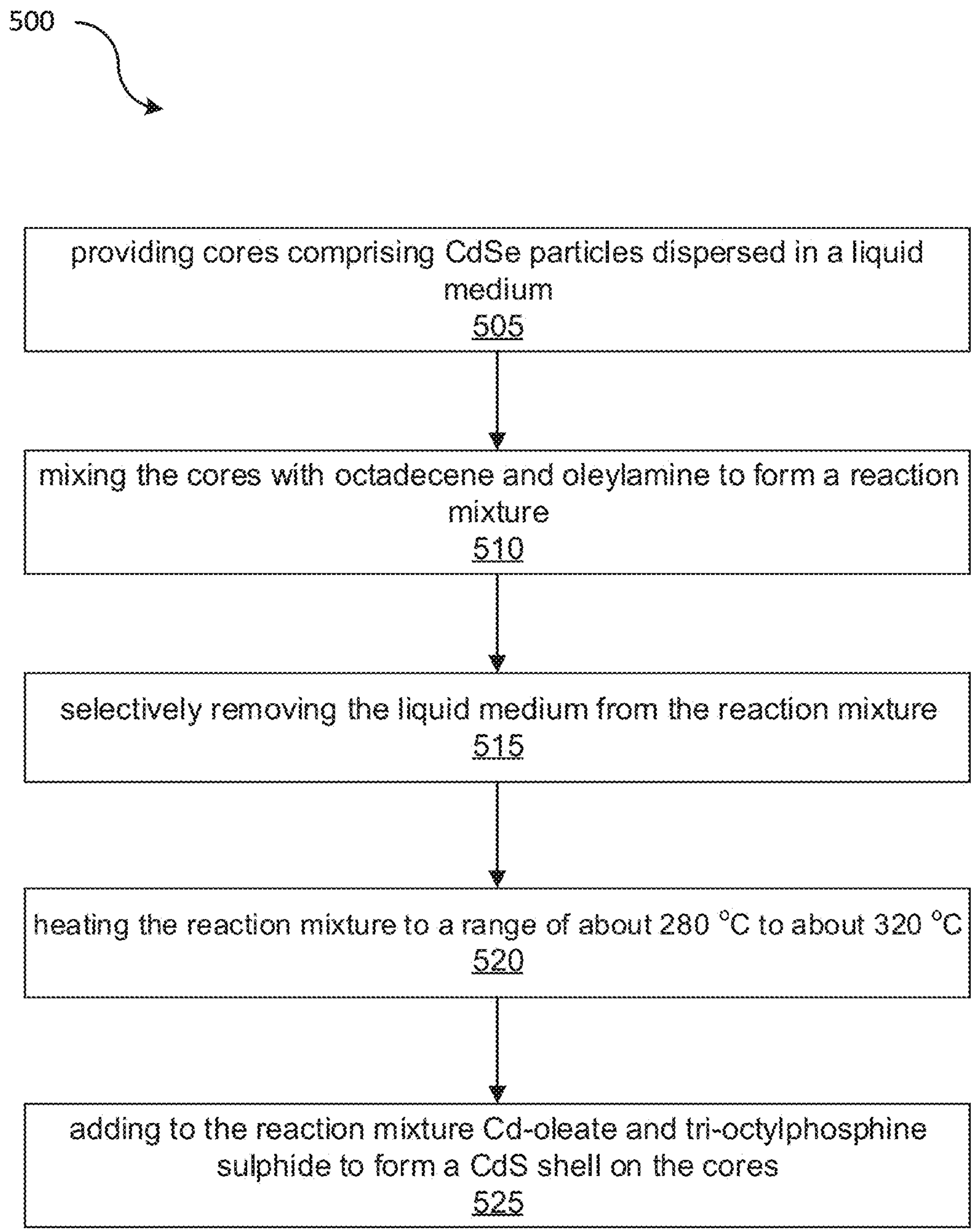
FIG. 5 shows a flow chart summarizing the steps of a method for synthesizing core-shell QDs, according to non-limiting implementations.

The core-shell QDs discussed herein can be synthesized as colloidal QDs. Referring to FIG. **2*a* (left), by way of non-limiting example QD 200 can be synthesized using a method 500 summarized in FIG. 5. At step 505, cores 205 can be provided, which cores comprise CdSe particles and are dispersed in a liquid medium. The CdSe particles can have a wurtzite crystal structure. At step 510, cores 205** can be mixed with octadecene and oleylamine to form a reaction mixture.

Oleylamine binds weakly to the facets of the CdSe cores 205. Next, at step 515 the liquid medium can be selectively removed from the reaction mixture. At step 520, the reaction mixture can be heated to a range of about 280° C. to about 320° C. Next, at step 525, Cd-oleate and tri-octylphosphine sulphide (TOPS) can be added to the reaction mixture to form the CdS shells 210 on cores 205. TOPS provides the sulfur precursor for shells 210. Moreover, TOPS does not bind to the (0001) facet of the cores 205, but binds to the remaining facets with about the same strength as oleylamine. The (0001) facet corresponds to first side 215 of cores 205. As such, oleylamine continues preferentially binding to first side 215 and blocking TOPS (i.e. the sulfur precursor) from reaching core 205 and reacting at first side 215. Because of the relative action of oleylamine and TOPS, no CdS shell can form on first side 215.

At the facets of core 205 other than the (0001) facet, both oleylamine and TOPS have about equally weak binding. As such, some TOPS can reach core 205 and react at these other facets, and CdS shell 210 continues to grow slowly on the facets of core 205 other than the (0001) facet. In some implementations, the Cd-oleate and the tri-octylphosphine sulphide can be added simultaneously and/or continuously to the reaction mixture.

In order to synthesize the passivating uniform shell 225, core-shell QD 200 can be dispersed in a liquid medium and heated to a range of about 280° C. to about 320° C. Then further Cd-oleate and octanethiol can be added to the reaction mixture as precursors for forming the additional CdS shell 225. Octanethiol acts as the sulfur precursor. Octanethiol binds relatively strongly to the (0001) facet of core 205, and as such can displace the oleylamine to allow for forming a uniform CdS shell that covers the (0001) facet (i.e. first side 215) as well as shell 210.

In some implementations, the further Cd-oleate and the octanethiol can be diluted in octadecene. In addition, in some implementations the further Cd-oleate and the octanethiol can be added simultaneously and/or continuously to the reaction mixture for forming shell 225. Moreover, in some implementations, forming shell 225 can further comprise adding oleylamine to the reaction mixture for forming shell 225, where the further oleylamine is configured to increase a dispersibility of the core-shell quantum dots as shown in FIG. 2(*a*).

More detailed synthesis and characterization information regarding core-shell QD 200 is provided below. While this detailed synthesis and characterization information is provided for the CdSe—CdS core-shell QD 200, it is contemplated that different syntheses methods can also be used for synthesizing the CdSe—CdS QD 200. In addition, it is also contemplated that similar and/or different synthesis methods can be used to synthesize core-shell QD where one or more of the core and the shell is made of a different material than CdSe and CdS respectively. In other words, the QDs and their synthesis methods described herein are not limited to the CdSe—CdS QD 200 made by the exact combination of ligands described above. It is contemplated that different core-shell material pairs and/or different ligand combinations and synthesis methods can be used to synthesize other core-shell QDs with asymmetrical lattice-mismatched shells, which QDs are biaxially strained leading to split first excitonic absorptions peaks, reduced optical gain thresholds, and narrower PL linewidths. All of these different biaxially-strained core-shell QDs are within the scope of this specification.

The following sections provide more detailed characterization and synthesis information regarding core-shell QD 200 and the version of QD 200 with shell 225 grown on shell 210, both shown in FIG. 2*a*. At the bandedge of CdSe colloidal QDs (CQDs), the electron level $1S_e$ is singly degenerate, with two spin projections; and holes comprise two closely-spaced $1S_{3/2}$ and $1P_{3/2}$ twofold-degenerate manifolds (see FIG. 3), resulting in eight states when spin projections are taken into account. In a hexagonal lattice, the crystal field lifts the degeneracy. The use of oblate shapes can further increase the splitting, while the prolate shape can counter the effect of the crystal field. In spherical CQDs, the splitting is comparable to the thermal energy at room temperature, and therefore holes distribute among all eight states. This thermal population decreases the state filling of bandedge hole levels and increases the PL linewidth even in the absence of inhomogeneous broadening.

FIG. 3 shows schematically CdSe CQD bandedge states, state filling and quasi-Fermi level splitting under hydrostatic and biaxial strain. $E_{Fe}$ and $E_{Fh}$ indicate the quasi-Fermi levels of electron and hole, respectively, and kT denotes the thermal energy. As shown on the left side of FIG. 1, in CdSe CQDs, the electron level is singly degenerate with two spin projections, and hole levels are four-fold degenerate with two spin projections each. Crystal field and shape anisotropy can lift the hole degeneracy, but the splitting remains comparable to the thermal energy, resulting in broadened photoluminescence and low state filling. This splitting is not affected by hydrostatic strain. As shown on the right side of FIG. 1, biaxial strain causes additional splitting, concentrating the holes into the lowest-energy levels. As a result, narrower photoluminescence and improved quasi-Fermi level splitting can be realized, lowering the gain threshold.

The optical gain condition in semiconductors is fulfilled when the splitting between the quasi-Fermi levels of electrons ($E_{Fe}$) and holes ($E_{Fh}$) is larger than the bandgap ($E_g$) (FIG. 3). For a single level electron and hole with only spin degeneracy, populating the dot with one exciton moves the quasi-Fermi levels to the respective bandedges, bringing the CQD to the onset of optical gain. In contrast, in a system with higher degeneracy, e.g. the valence band of CdSe CQDs, a single charge carrier is spread among the eight (including spin) hole states, significantly reducing the population per state (FIG. 3). The hole quasi-Fermi level thus remains further away from the bandedge and the quasi-Fermi level splitting remains smaller than the bandgap. Extra excitons are therefore needed to achieve the required population of the bandedge states. For typical CdSe CQDs at room temperature, threshold is achieved at $\langle N\rangle \approx 2.7$, where $\langle N\rangle$ is the average per-dot excitonic occupancy (Simulation Methods and FIG. 7*a*-7*c*). These higher-multiplicity excitons are responsible for speeding up Auger recombination, significantly shortening the optical gain lifetime.

Hydrostatic compressive strain modifies the bandgap but does not affect the bandedge fine structure. Biaxial strain, in contrast, lifts the degeneracy by affecting heavy and light holes to different extents. In CQDs, an external asymmetric compressive strain can split the hole states; however, this only leads to broadening of the ensemble PL peak as a result of random orientation of the CQDs. Moreover, splitting of the bandedge exciton transition in CQDs with a built-in asymmetric strain may not yield narrower PL due to a lack of strain uniformity or CQD size uniformity in the ensemble.

If, on the other hand, this splitting is applied homogeneously to all CQDs in the ensemble, and rendered materially larger than the thermal energy, then the population of hole states would accumulate closer to the bandedge, resulting in narrower emission linewidths (FIG. 3). At the same time, under the same excitation intensities, the effective degeneracy of the bandedge states would decrease, leading to lower optical gain thresholds closer to $\langle N\rangle=2$ (Simulation Methods and FIGS. 7*a*-7*c*).

This specification discloses a synthesis route to introduce a built-in biaxial strain, homogeneous or substantially homogeneous throughout the ensemble, while maintaining good surface passivation. In CdSe—CdS core-shell CQDs, the lattice mismatch between CdS and CdSe is ~3.9%, leading to a hydrostatic compressive strain of the cores inside the spherical shells. Thus, sufficient biaxial strain can be achieved by growing an asymmetric shell. The synthesis starts from the inherently asymmetric wurtzite crystal structure: its $\{0001\}$ facets are different from one another, the (0001) exposing Cd atoms with one dangling bond, and the $(000\bar{1})$ exposing Cd atoms with three dangling bonds. This difference can result in linear dot-in-rod CdSe—CdS core-shell nanostructures with a core offset from the center. However, this prolate shape counters the built-in crystal field effect, as discussed above, and therefore enhances—instead of lifting—the degeneracy.

The synthesis method proposed here takes a different approach, one that would overcome the tendency of the polar lattice to take the prolate crystal shape. Shell growth using tri-octylphosphine sulphide (TOPS) can provide facet selectivity; and routes that employ thiols as precursors in combination with primary amine ligands can produce isotropic shell growth. The present synthesis method utilizes these two effects in combination.

Density functional theory (DFT) calculations revealed that octanethiol binds similarly on both $\{0001\}$ CdSe facets, and much more strongly than the complementary ligand oleylamine (~3 vs. ~0.5 eV) (Simulation Methods and Data Table 1). Therefore, CdS tends to grow epitaxially on the CdSe surface without facet selectivity. In contrast, TOPS binds more weakly and very differently on (0001) and $(000\bar{1})$ facets (0 vs. 0.5 eV), resulting in a high degree of facet selectivity. Since TOPS does not bind to the CdSe (0001)

facet at all, even a weak ligand such as oleylamine can block CdS growth on this (0001) facet while allowing the (000$\bar{1}$) facet to grow slowly.

Figure 2B:
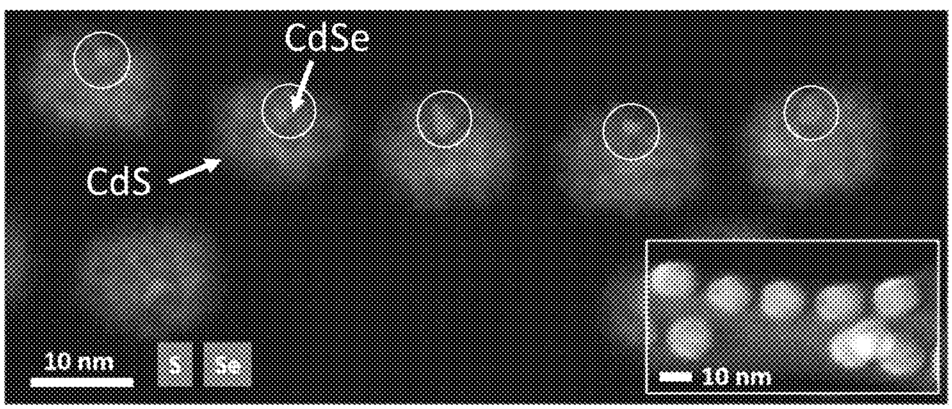
Figure 2C:
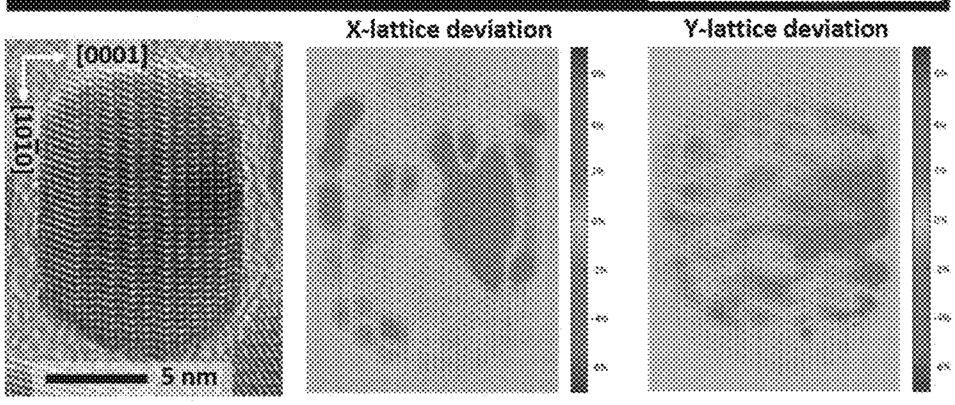

FIGS. 2*a-c* shows growth of asymmetric nanocrystals using FSE. FIG. 2*a* shows the FSE growth mechanism: TOPS binds weakly on (000$\bar{1}$) facet but does not bind on the (0001) facet (dots indicate Cd dangling bonds). The primary amine can block the CdS shell growth on CdSe (0001) facet while keeping the opposite facet growing slowly. Both facets can grow simultaneously when strongly-binding octanethiol is used as sulfur source. FIG. 2*b* shows that STEM-EDS mapping corroborates the asymmetric CdS shell on the CdSe core, with the inset shows HAADF-STEM image of asymmetric dots. FIG. 2*c* shows an HRTEM image and the corresponding mapping of the lattice spacing deviation from the CdS value, which indicate the presence of biaxial strain.

Figure 8B:
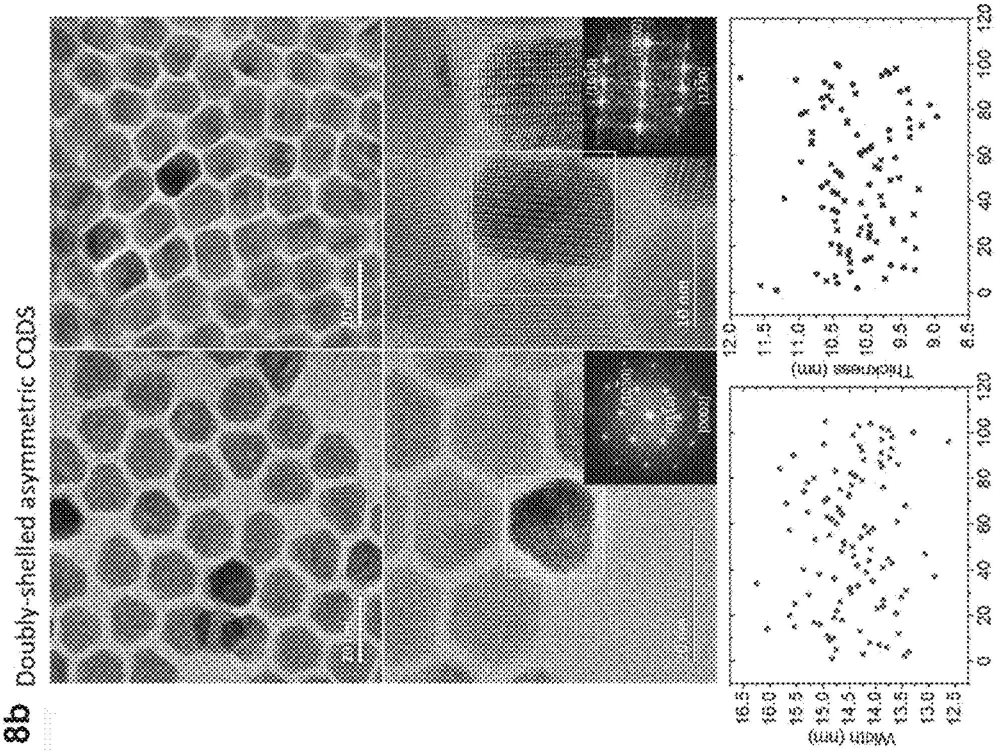
FIGS. 8*a-c* show sizes and exciton decay dynamics of singly- and doubly-shelled QDs.
Figure 8A:
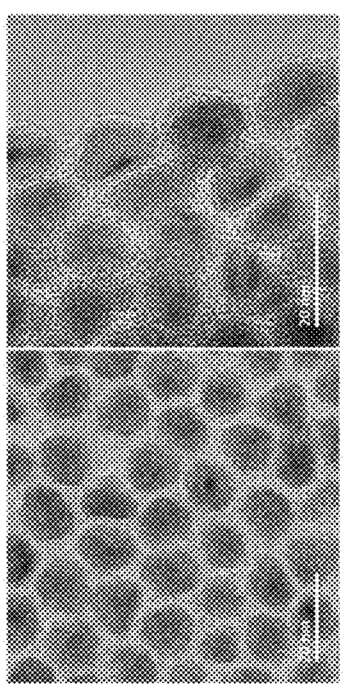
Figure 8C:
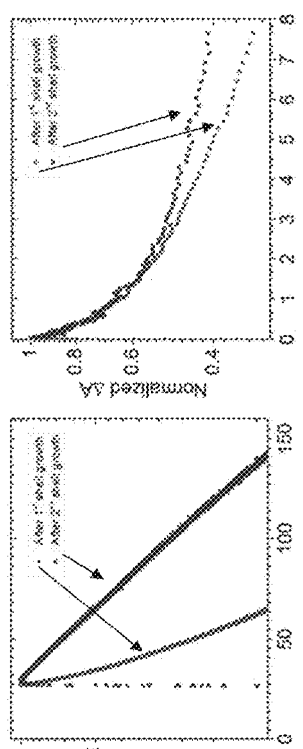

The FSE protocol can grow an asymmetric shell in an oblate shape (FIG. 2*a*, Synthesis Methods and Extended Data FIG. 8*a*). Since efficient (0001) termination also leaves this facet unpassivated, it results in a low photoluminescence quantum yield (PLQY) (25%), and the absence of the shell on one side can lead to a short Auger lifetime (~400 ps) (FIG. 8*c*). Therefore, a uniform second shell was grown by switching the sulfur precursor to octanethiol after TOPS injection (FIG. 2*a* and Synthesis Methods). The final PLQY of the two-shell quantum dots reaches 90% in solution and a relatively high PLQY of 75% in solid film (FIG. 8*c*). The Auger recombination lifetime was extended slightly to ~600 ps (FIG. 8*c*).

The morphology of the asymmetric CQDs obtained can be seen in high-angle annular dark-field scanning transmission electron microscopy (HAADF-STEM) (inset in FIG. 2*b*) and bright-field transmission electron microscopy (TEM) (FIG. 8*b*) images. It shows an oblate shape with a diameter of 14.4±0.7 nm and a thickness of 10.1±0.6 nm, with a narrow ensemble size distribution. CdSe cores are consistently decentered and/or eccentrically disposed inside the oblate CdS shell, as shown in STEM-energy-dispersive X-ray spectroscopy (EDS) elemental mapping (FIG. 2*b*), a finding that supports the FSE growth mechanism.

High-resolution transmission electron microscopy (HR-TEM) reveals lattice fringes along the [12$\bar{3}$0] zone axis, allowing lattice spacing mapping (FIG. 2*c*) to investigate whether the lattice does indeed exhibit biaxial strain. On one side of the nanocrystal, distortion of the vertical lattice fringes suggests that the core is squeezed out by the compressive strain in the other two directions. The lattice fringe spacing map along the horizontal direction (X axis) shows stronger deviation from the underlying CdS, approaching undistorted CdSe, implying that the strain along this horizontal direction has been released. The lattice fringe spacing along the vertical direction remains closer to CdS, indicating stronger compression of the core, and thus biaxial strain.

FIG. 4*a-d* show optical characterizations of CdSe—CdS core-shell CQDs. FIGS. 4*a-b* show ensemble absorption and PL spectra, Lorentzian fits of single-dot PL spectra, and tight-binding model simulated exciton fine structure of hydrostatically strained and biaxially strained CQDs, respectively. FIGS. 4*c-d* show optical gain threshold measurements on the two different types of CQDs. The photoexciting energy was selected as 2.18 eV to avoid absorption by the shell and ensure equal exciton populations. The instantaneous total absorption was collected 27 ps after pulsed excitation.

The absorption spectra of hydrostatically and biaxially strained CQDs (FIG. 4*a*-3*b* and FIG. 9*a*-9*b*) having similar average size (insets in FIG. 10) and absorption cross section exhibit two differences: the first absorption peak in biaxially strained CQDs is split into two, and it shows a much steeper absorption edge. A series of samples with different degrees of thin-shell asymmetry reveal a progressive splitting of the first exciton peak (FIG. 10), reaching a maximum of 67 meV. After a second uniform shell of several CdS monolayers is added, the splitting decreases slightly to 55 meV (FIG. 4*b*).

These interpretations are confirmed by tight-binding atomistic simulations (Simulation Methods, FIGS. 11-12 and Data Tables 2-3). In hydrostatically strained CQDs, the bright transitions within the first exciton manifold are split by only 20 meV (FIG. 4*a*), while in the presence of biaxial strain, the bright transitions are split by ~55 meV (FIG. 4*b* and FIGS. 11-12). This can explain the sharpness of the absorption edge in the biaxially strained case. For the same reason, the Stokes shift of the biaxially strained CQDs is 24 meV, much smaller than that of CQDs under hydrostatic strain (40 meV). It should be noted that the lowest-energy excitons in CQDs are dark due to spin-selection rules, and photoluminescence comes from thermally populated higher-energy bright states. Biaxial strain does not affect the electron-hole exchange interaction strength, and the dark-bright splitting remains small (FIG. 4*a*-3*b* and FIG. 12*d*). Temperature-dependent PL decay is shown to be similar in the two types of CQDs (FIG. 13).

Single-dot and ensemble PL measurements were carried out to monitor the emission states and the broadenings for the two dot types. Hydrostatically strained CQDs show average single-dot and ensemble PL linewidths (full-width at half-maximum (FWHM)) of 63±7 meV and 95 meV (FIG. 4*a* and FIG. 14), respectively (a ±25% broadening is common in giant core-shell CQDs). In contrast, the biaxially strained core-shell CQDs have a single-dot PL FWHM as narrow as 36±3 meV vs. 54 meV in ensemble (FIG. 4*b* and FIG. 14). This single-dot emission linewidth is even narrower than that from single nanoplatelets, whose light and heavy holes are well separated by extreme quantum confinement. This twofold reduction of the single-dot linewidth in biaxially strained dots is due to two main reasons: i) exciton fine structure has been substantially spread out—to an extent that notably exceeds the thermal energy, ii) exciton coupling to LO phonons has been suppressed in this asymmetric core-shell structure, which accounts for additional narrowing. The ensemble PL linewidth in biaxially strained dots indicates inhomogeneous broadening comparable to the hydrostatically strained case. However, it still represents a ~20% improvement in comparison to previously reported narrowest-linewidth CQDs and core-shell nanoplatelets. An even narrower ensemble PL (FWHM of 50 meV) can be obtained in biaxially-strained CQDs having thinner CdS shells (FIG. 10).

Ultrafast transient absorption (TA) spectroscopy was used to measure the optical gain threshold of both the biaxially and hydrostatically strained CQDs. In the femtosecond and picosecond regimes, the optical gain threshold of CQDs is affected by two key parameters: 1) the absorption cross-section, which controls how many excitons are generated at a given photoexcitation power density; 2) the average excitons-per-dot occupancy $\langle N \rangle$ needed to reach the point where stimulated emission overcomes absorption. To decouple the impact of the absorption cross-section, identical cores were used to grow the hydrostatically vs. biaxially strained CQDs, and performed TA measurements by photoexciting at 2.18 eV with 250 fs pulses, thus eliminating absorption by the shell and ensuring comparable average occupancy. Gain thresholds of 492 and 702 μJ/cm$^2$ for biaxially and hydrostatically strained dots in solution, respectively, indicate a factor of 1.43 reduction in terms of per-pulse fluence for the former type of structures (FIG. 4*c*-4*d* and FIG. 15). The corresponding exciton occupancies were calculated by multiplying the photoexcitation fluences and the measured absorption cross-sections (Characterization Methods and FIG. 9), and values of <N>=2.3±0.4 and 3.2±0.6 were obtained for the biaxially and hydrostatically strained dots, respectively. This is consistent with the <N>=2.2 and 2.7 obtained from numerical gain modeling, which takes into account state degeneracy, splitting, thermal population, linewidth, and Poisson statistics (Simulation Methods and FIG. 7*a*-7*c*). Simulations show that differences in linewidth do not contribute significantly (~5% only) to threshold improvement (FIG. 7*c*).

In lasers, CQDs are usually photoexcited above the shell bandgap in order to take advantage of the large absorption cross-section of the shell and thus achieve the threshold occupancy <N> at lower external photoexcitation power. Therefore amplified spontaneous emission (ASE) thresholds were acquired using shell photoexcitation. Spin-cast CQD films with similar thicknesses and uniformity (FIG. 16) were photoexcited using 1 ns, 3.49 eV laser pulses. Biaxially and hydrostatically strained dots showed ASE thresholds of 26 and 36 μJ/cm$^2$ per pulse, respectively (FIG. 17). Lower ASE thresholds of 14 and 22 μJ/cm$^2$ were observed when 250 fs (3.49 eV) laser pulses were used instead (FIG. 17); this can be attributed to the reduction of Auger recombination losses at the pumping stage. The 1.4 to 1.6-fold reduction in the ASE threshold for the biaxially strained sample is attributed to the reduced gain threshold, since the biexciton Auger lifetime (FIG. 18) and absorption cross section (FIG. 9*c*-9*d*) remain similar for the two samples and thus do not contribute to the observed improvement.

Reducing the gain threshold can be advantageous for realizing CW lasing. More than 80% of incident power aimed at achieving population inversion is converted to heat due to Auger recombination losses. Even modest improvements in gain threshold provide amplified benefit of reduced heat generation (FIG. 7*d*) in the CW regime, helping avoid film damage under continuous exposure to intense laser light. To demonstrate sustained lasing, a film of biaxially strained CQDs was incorporated into a photonic crystal distributed feedback (PC-DFB) optical cavity (FIG. 6*a*, FIG. 19 and Characterization Methods). The device was adhered with thermal paste to a Peltier stage in order to assist further with thermal dissipation.

Figures 6A, 6B, 6C, 6D:
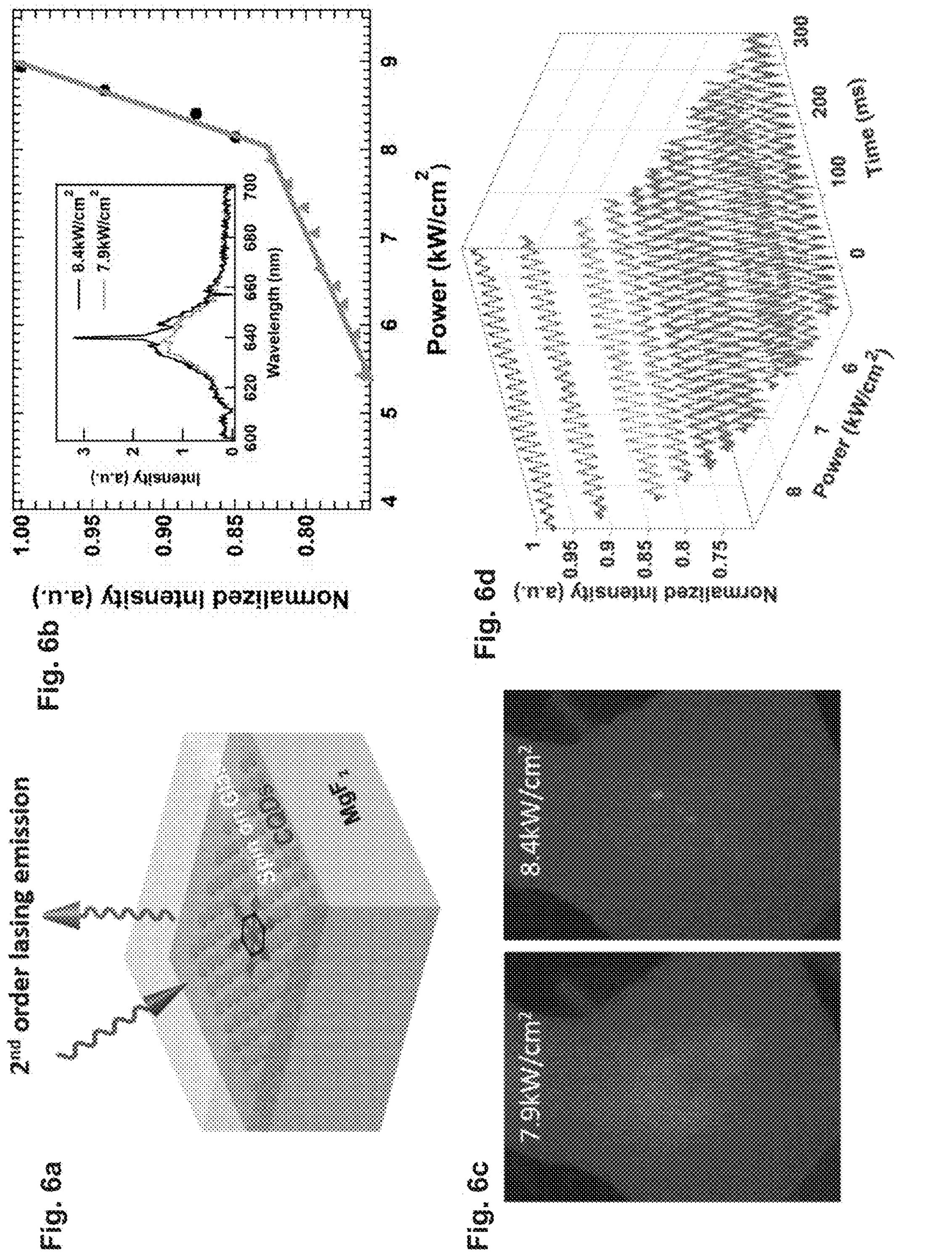
FIGS. 6*a-d* show an example of continuous-wave photonic crystal, distributed feedback CQD laser, according to non-limiting implementations.
Figures 20A, 20B, 20C, 20D, 20E, 20F, 20G:
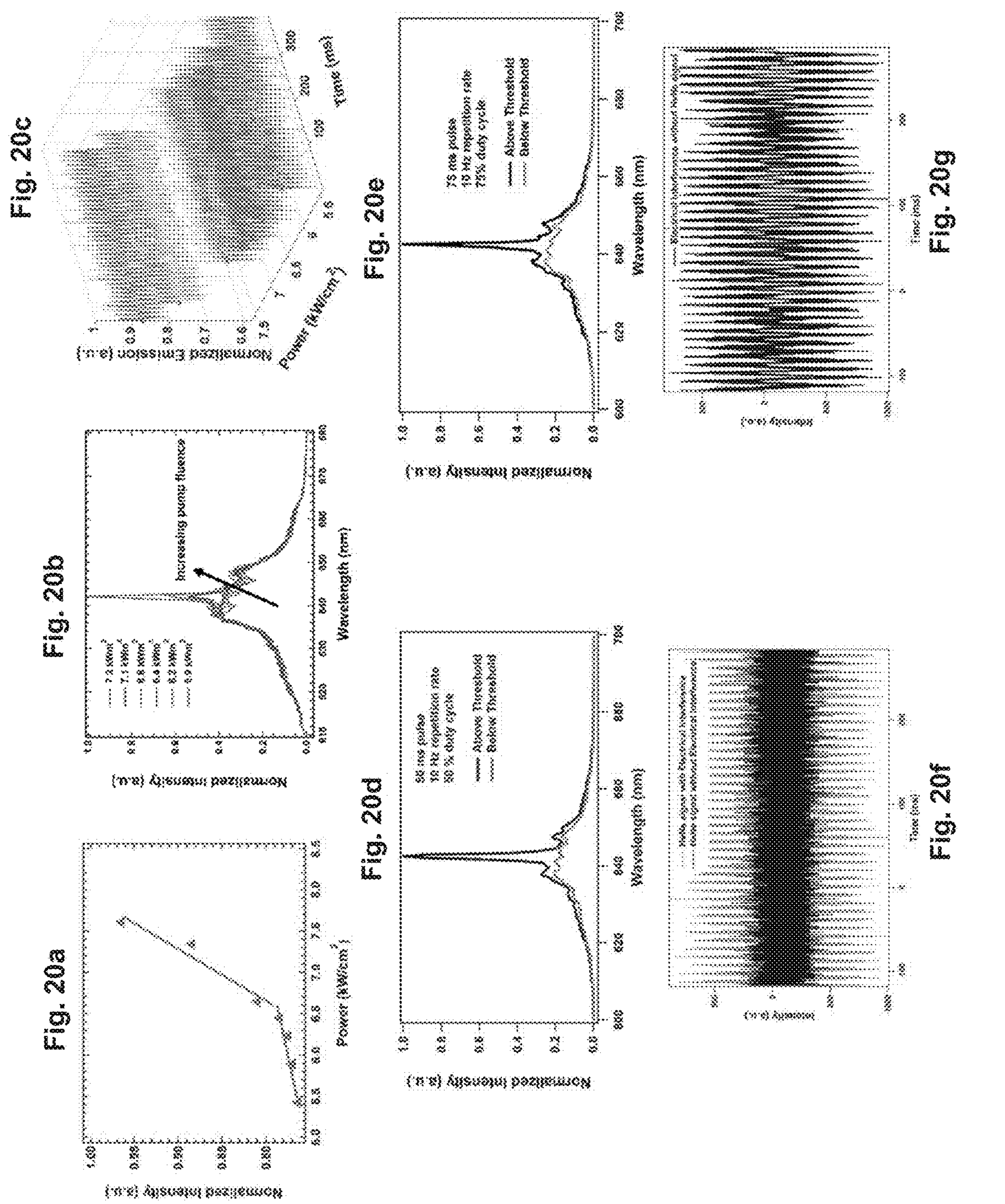
FIGS. 20*a-g* show another CW PC-DFB QD laser with threshold of 6.4 $kW/cm^2$.

FIGS. 6*a*-*d* show an example continuous-wave photonic crystal—distributed feedback CQD laser. FIG. 6*a* shows a schematic of the PC-DFB device used for lasing. Emission was collected normal to the substrate surface. FIG. 6*b* shows normalized emission as a function of peak power when optically photoexcited at 442 nm with CW laser. Insets show emission spectra above and below the lasing threshold, showing a 640 nm lasing peak with ~0.9 nm FWHM. FIG. 6*c* shows the photographs of emission below and above threshold, respectively. Above the threshold, bright lasing spots are visible. Images were converted to intensities and displayed with a grey color scale. FIG. 6*d* shows normalized emission intensity of the PC-DFB laser as a function of time and incident power while excited with CW laser. The fluctuation of the signal originates from electronic noise induced by the acousto-optic modulator (AOM) on the oscilloscope (FIG. 20*f*-20*g*).

The PC-DFB cavity was photoexcited at 442 nm using a CW laser. Emission was collected in the direction normal to the substrate surface. The excitation-power dependent emission intensities show lasing thresholds of ~6.4-8.4 kW/cm$^2$ (FIG. 6*b* and FIG. 20), which are ~7 times lower than that of the longest sustained CQD laser reported previously (50 kW/cm$^2$) (Data Table 4). These powers are consistent with the results from thermal calculations, which state that CW lasing is possible when the power is below 10 kW/cm$^2$. The lasing emission peak wavelength is 640 nm (inset in FIG. 6*b*), with a FWHM of 0.9 nm (limited by the resolution of the spectrometer used). The directionality of the laser beam was displayed by placing a card ~5 cm away from the sample. Below the threshold, diffuse emission due to PL is visible; while above the threshold, several bright laser spots are visible, showing almost no divergence, in the center of the emission beam (FIG. 6*c*). The lasing output was monitored using an oscilloscope, and it was found that the devices did indeed lase continuously. The traces exhibited threshold behavior as well as steady signal at each excitation power (FIG. 6*d*). CW lasing lasted for ~30 and 10 mins before thresholds increased, in devices with 6.4 and 8.4 kW/cm$^2$ thresholds, respectively. As an additional test, pulsed excitation experiments at a 10 Hz repetition rate were performed, using 50% (50 ms pulse) and 75% (75 ms pulse) duty cycles. By applying a delay to the spectrometer acquisition, the spectra of the last ten microseconds of the pulse were measured, showing a lasing peak when above threshold (FIG. 20*d*-20*e*).

A special note should be added regarding the biexciton CW lasing result from solution processed nanoplatelets, in contrast to the instant specification which uses core-shell QDs 200 to achieve CW lasing. In the case of nanoplatelets, a discrepancy of ~4 orders of magnitude exists between the experimental CW ASE threshold, and the expected CW threshold extrapolated based on the biexciton lifetime and the threshold obtained using fs pulse excitation (6 W/cm$^2$ vs. 48 kW/cm$^2$) (Data Table 4). This raises questions regarding the observed ASE and CW lasing, especially in the absence of confirmation of spatial coherence of lasing emission.

The instant specification is believed to be the first observation of CW lasing from solution processed materials where the results are confirmed using spatial coherence and are accompanied by consistent thresholds for pulsed vs. CW photoexcitation.

Methods

Experimental Methods

Chemicals

Cadmium oxide (CdO, >99.99%), sulfur powder (S, >99.5%), selenium powder (Se, >99.99%), oleylamine (OLA, >98% primary amine), octadecene (ODE, 90%), oleic acid (OA, 90%), tri-octylphosphine (TOP, 90%), tri-butyl phosphine (TBP, 97%), tri-octylphosphine oxide (TOPO, 99%), octadecylphosphonic acid (ODPA, 97%), 1-octanethiol (>98.5%), thionyl chloride ($SOCl_2$), toluene (anhydrous, 99.8%), hexane (anhydrous, 95%), acetone (99.5%) and acetonitrile (anhydrous, 99.8%) were purchased from Sigma Aldrich and used without further purification.

CQDs Synthesis Methods

CdSe CQD Synthesis

CdSe CQDs were synthesized using the following exemplary and non-limiting method: 24 g TOPO and 2.24 g ODPA and 480 mg CdO were mixed in a three neck flask with 100 mL volume, the reagents and solvents was heated to 150° C. for 1 h under vacuum, and then the temperature was raised to 320° C. and kept at this temperature for about 1 h under nitrogen atmosphere. 4 mL of TOP were injected into the mixture and the temperature was further brought to 380° C. 2 mL Se in TOP solution (60 mg/mL) were injected and CQDs exhibiting an exciton peak at 590 nm were synthesized as a result of ~3 min growth, after growth, the reaction flask was removed from heating mantle and naturally cooled to ~70° C., CQDs were collected through adding acetone and centrifugation (6000 rpm, 3 min). The produced nanoparticles were redispersed in hexane for growing the shells.

Syntheses of Cd-Oleate and TOPS 2.98 g CdO was fully dissolved in 40 mL oleic acid at 170° C. under vacuum and then nitrogen to get Cd-oleate. TOPS was prepared by mixing and magnetically stirring 960 mg sulfur powder in 16 mL TOP inside a glovebox.

Facet-Selective Epitaxy (FSE)

First Asymmetric Shell Growth

Shell 210 can be grown using the following exemplary and non-limiting method: by measuring the absorbance at peak exciton (590 nm) with 1 mm path length cuvette, CdSe CQDs were quantified. A 5.8 mL CdSe in hexane dispersion with an optical density of 1 at the exciton peak was added into a mixture of 42 mL ODE and 6 mL OLA in a 500 mL flask, and pumped in vacuum at 100° C. to evaporate hexane, then the solution was heated to 300° C. and kept for 0.5 h. As-prepared 9 mL Cd-oleate was diluted in 15 mL ODE and 3 mL TOPS in 21 mL ODE as sulfur precursor, respectively. Cd-oleate and TOPS solutions were injected simultaneously and continuously at a rate of 6 mL/h.

Second Uniform Shell Growth

Shell 225 can be grown using the following exemplary and non-limiting method: 4 mL Cd-oleate diluted in 20 mL ODE and 427 μL octanethiol diluted in 23.6 mL ODE were continuously injected at a speed of 12 mL/h to grow second shell. The reaction temperature was elevated to 310° C. before injection. After 13 mL injection of Cd-oleate in ODE solution, 5 mL oleylamine was injected into the solution to improve dispersibility of the CQDs.

CQD Samples Referred to as Asymmetric CQD 1, 2 and 3 with Reference to FIG. 10

Sample asymmetric CQD 3 was synthesize by growing only asymmetric shell as mentioned above, no secondary uniform shell was grown. Sample asymmetric CQD 2 was synthesized with similar protocol as sample asymmetric CQD 3, besides the reaction solvent (42 mL ODE and 6 mL OLA) was substituted with 24 mL ODE and 24 mL OLA. Sample asymmetric CQD 1 was synthesized by repeating the asymmetric CQD 2 shell growth twice.

Hydrostatically Strained CQDs Synthesis

Symmetric CQDs were synthesized using the following method: a 8.8 mL CdSe core dispersion with an optical density of 1 at the exciton peak 590 nm was added into a mixture of 24 mL ODE and 24 mL OLA in a 500 mL flask, and pumped in vacuum at 100° C. to evaporate hexane, then the solution was heated to 310° C. and kept for 0.5 h. 6 mL as-prepared Cd-oleate was diluted in 18 mL ODE and 640 μL octanethiol in 23.36 mL ODE as sulfur precursor. Cd-oleate and octanethiol solutions were injected simultaneously and continuously at a rate of 12 mL/h. After injection, 4 mL OA was injected and the solution was further annealed at 310° C. for 10 min.

Core-Shell CQDs Purification

When the injection was complete, the final reaction mixture was naturally cooled to ~50° C. and transferred into 50 mL plastic centrifuge tubes, no anti-solvent was added and the precipitation was collected after 3 min centrifugation at a speed of 6000 rpm. 20 mL hexane was added into the centrifuge tubes to disperse the CQDs, and acetone was added dropwise until the CQDs started to aggregate. The precipitation was collected again by 3 min centrifugation at a speed of 6000 rpm, this dispersing and precipitation process was repeated 3 times to remove all or substantially all of the smaller CdS CQDs. This purification process can allow the asymmetric shell growth, as there is a significant amount of self-nucleated CdS CQDs after synthesis due to the weak binding energies between TOPS and CdSe CQDs surfaces (see Data Table 1). The final CQDs were re-dispersed in octane with first exciton peak absorbance in 1 mm path length fixed as 0.25.

Chloride Ligand Exchange

500 μL of the above CQDs dispersion were vacuum dried and then dispersed in 1 mL toluene solution, 1.25 mL TBP, followed by 1 mL $SOCl_2$ in toluene solution (volume ratio of 20 μL $SOCl_2$:1 mL toluene) was added into the CQDs in toluene dispersion inside the glovebox. The CQDs precipitated immediately and the resulting dispersion was transferred out from the glovebox and subsequently ultra-sonicated for 1 min. After exchange, anhydrous hexane was added to precipitate the CQDs completely before centrifugation at 6000 rpm. CQDs were purified with three cycles of adding anhydrous acetone to disperse the CQDs and adding hexane to precipitate the CQDs dispersion. The chloride ligands terminated CQDs were finally dispersed in 750 μL anhydrous acetonitrile for laser devices fabrication.

Characterization Methods

Ensemble Absorbance, PL and Single-Exciton Decay Measurements

CQDs in hexane dispersion were collected into a 1 mm path length quartz cuvette and measured on the PerkinElmer Lambda 950 UV/Vis/NIR Spectrophotometer over an excitation range from 400 nm to 800 nm. PL spectra and decay data of diluted solution samples were collected on the Horiba Flurolog TCSPC system with an iHR 320 monochromator and a PPO•900 detector. Integrating sphere was used for film and solution PLQY measurement.

Single-Dots PL Measurement

Dilute solutions of CQDs in hexanes were drop-cast on quartz substrates. Single-particle PL measurements were conducted using a custom-built confocal microscope. Samples were excited by a 400 nm, 76 MHz pulsed laser at low excitation powers (~5 W/cm$^2$). PL emission from individual QDs was collected through the objective (Olympus, 1.2 NA), projected onto the entrance slit of an Ocean Optics QE spectrometer (600 l/mm) equipped with a Hamamatsu, back-illuminated cooled CCD array for detection. Time series of integrated spectra were acquired at room temperature with integration times of 50 ms.

Transient Absorption Measurement

The 1030 nm fundamental (5 kHz) was produced by a Yb:KGW regenerative amplifier (Pharos, Light Conversion). A portion of this beam was sent through an optical parametric amplifier (Orpheus, Light Conversion) to generate the 2.18 eV photoexcitation pulse (pulse duration~250 fs). Both the photoexcitation and fundamental were sent into an optical bench (Helios, Ultrafast). The fundamental, after passing through a delay stage, was focused into a sapphire crystal, generating the probe as a white light continuum. The frequency of the photoexcitation pulse was reduced to 2.5 kHz using a chopper. Both beams were then focused onto the sample, which was housed in a 1 mm cuvette. The probe was then detected by a CCD (Helios, Ultrafast). Samples were translated 1 mm/s during the measurement.

Absorption Cross Section Measurement

CQDs were dispersed in hexane to measure the absorption cross-section using the following method:

$$\sigma = \frac{2.303\ A}{cl}$$

$\sigma$: absorbance cross section of $CQDs$;

$A$: absorbance of $CQD$ in hexane dispersion at certain wavelength;

$c$: number of nanocrystals per $cm^3$;

$l$: light path length of the cuvette in unit of cm;

$c$ was calcuted by following the equation $c = \frac{N_{total}}{N_{single} * 0.4}$.

400 μL of CQDs dispersion with known absorbance was digested in nitric acid and diluted to 10 mL aqueous solution. Inductively coupled plasma optical emission spectroscopy (ICP-OES) (Optima 7300 ICP AES) was applied to determine the total amount of Cd atoms ($N_{total}$), the single dot Cd atom numbers were estimated from the volume of the CQDs ($N_{single}$), which were determined from the TEM images (see FIG. 8 and FIG. 13). Hydrostatically strained dots were assumed as circular cone shape with bottom radius of 15±1 nm and height of 15.2±1 nm. Biaxially strained dots were considered as hexagonal prism with average lateral dimension of 12±1 nm and height of 10 nm. Total volumes of 907±180 $nm^3$ and 935±157 $nm^3$ were obtained, respectively. See FIG. 9*c*-9*d* for absorption cross sections of two types of CQDs.

HRTEM and STEM-EDS Mapping

HRTEM and STEM-EDS samples were prepared by adding a drop of the solution of CQDs onto an ultrathin-carbon film on lacey-carbon support film (Ted Pella 01824) and were baked under high vacuum at 165° C. overnight and subsequently imaged using a Tecnai Osiris TEM/STEM operating at 200 kV. Drift-corrected STEM-EDS maps were acquired using the Bruker Esprit software with a probe current on the order of 1.5 nA and ~0.5 nm probe size.

Lattice Spacing Mapping

For the lattice spacing mapping, the HRTEM image of FIG. 2*c* was analyzed by means of image processing algorithms developed in MATLAB. The HRTEM image was first filtered by means of a custom-made FFT spatial filter, to reduce noise. A particle detection algorithm available as part of the MATLAB image processing toolbox was then used to identify the peaks, from which the weighted center of mass was extracted for each peak. The distances between peaks throughout the image were compared to the respective distances in the CdS shell in order to determine the deviation with respect to the CdS lattice.

Lasing Device Fabrication

The $2^{nd}$ order distributed feedback hexagonal array was fabricated by first spin-coating a thin layer of Poly (methyl methacrylate) (PMMA) (950K A5) at 3500 RPM for 60 s onto the substrate and cured at 180° C. for 60 s. The PMMA was coated with a thin layer (~8 nm) of thermally evaporated aluminum for laser height alignment and charge dissipation. The PMMA was patterned using a Vistec EBPG 5000+E-beam lithography system into a 2D hexagonal array of circles with a diameter of 160 nm and periodicity of 430 nm spacing between adjacent circular pillars. The aluminum layer was stripped using Developer 312. PMMA was developed using a 1:3 mixture of methyl isobutyl ketone (MIBK):IPA for 60 s. A 60 nm layer of $MgF_2$ was then thermally evaporated onto the device. For lift-off, the substrate was soaked in acetone overnight and then left in acetone for four hours followed by 30 minute stirring and acetone rinse.

The devices were cleaned by oxygen plasma for 5 minutes. Chloride exchanged biaxially strained CQDs were spin-coated onto the PC-DFB array at a spin speed of 1000 RPM for 60 s and was exposed to air for one day. A protective layer of spin-on-glass (Filmtronics 500F) was spin coated at 3000 RPM for 12 s and annealed in a $N_2$ atmosphere for 60 min at 100° C.

SEM and AFM Characterizations

The morphologies of the samples were investigated using SEM on a Hitachi SU-8230 apparatus with acceleration voltage of 1 kV. The AFM measurements were performed using Asylum Research Cypher S operating in AC contact mode.

Laser Characterization

The laser devices were adhered with thermal paste to a Peltier stage in order to assist further with thermal dissipation. The front surface of the Peltier was cooled to −26° Celsius, and a stream of compressed air was used to prevent frost buildup. The resulting temperature of the device, in the absence of photoexcitation, was measured to be −20+0.2° Celsius using thermocouples. Optical pumping was achieved using one 442 nm 3 W laser diode. For pulsed operation, the continuous-wave photoexcitation was modulated using an acousto-optic modulator (IntraAction Corp., rise time~300 ns). For continuous wave photoexcitation, the AOM was used to constantly modulate the original beam, creating a second continuous wave at a different wave vector. The photoexcitation beam was focused onto the sample to a spot size of 30 μm×50 μm. The emission was collected through two lenses into a single-mode or a 50 μm fiber. The spectrum was measured using an Ocean Optics USB2000+ spectrometer. Transient measurements were taken by collecting the laser emission through two lenses into a 200 μm diameter fiber, passing it through a monochromator (Photon Technology International, 600 L/mm, 1.25 μm blaze, 1 mm slit widths) to filter out photoluminescence, and coupling it to a Si photodetector (Thorlabs DET 36 A, rise time=14 ns). The photodetector response was measured using a 1 GHz oscilloscope. High frequency noise was removed from the signal by a fast Fourier transform (FFT).

ASE Thresholds and Variable-Stripe-Length Measurements

CQD films were spin coated at a spin speed of 3000-1000 RPM for 60 s onto glass substrates. Films were exposed to air for one day before ASE characterization.

For ns measurements, ASE was measured using a 1 ns pulse duration laser with a wavelength of 355 nm and frequency of 100 Hz. A 20 cm focal length cylindrical lens was used to focus the beam to a stripe with dimensions of 2000 μm×10 μm. The sample was excited perpendicular to the surface of the film and the emission was collected parallel to the film surface from the edge of the sample. The emission was collected directly into a 50 μm diameter multi-mode fiber. The emission spectrum was measured using an Ocean Optics USB2000+ spectrometer. The modal gain was measured using the variable stripe length (VSL) method. The stripe width was 10 μm and the length was varied between 100 μm to 400 μm. The emission was collected directly into a 50 μm fiber, and the modal gain was determined by the ASE emission intensity vs. stripe length relation using the equation $I(L)=A[e^{gL}-1]/g$, where I is the ASE emission intensity, A is a constant proportional to spontaneous emission intensity, g is the modal gain and L is the stripe length.

For fs measurements, ASE was measured using a ~250 fs pulse duration with a wavelength of 355 nm and a frequency of 5 kHz. These pulses were produced using a regeneratively amplified YB:KGW laser (Light Conversion, Pharos) and an optical parametric amplifier (Light Conversion, Orpheus). A lens was used to defocus the beam into a circular spot of a ~1 mm diameter, and emission was collected directly with a 50 μm fiber into an Ocean Optics USB2000+ spectrometer.

Simulation Methods

Exciton Fine Structure Under Hydrostatic and Biaxial Strain

Exciton fine structure calculations were performed using a methodology as implemented in QNANO computational package. Single-particle electronic states of the quantum dots (QDs) are computed within the tight-binding method, parametrized to reproduce the band structure of bulk CdSe and CdS calculated within density functional theory (DFT) methodology using VASP software including spin-orbit interactions and using PBE exchange-correlation functional. The bandgap is then corrected to experimental value by shifting the conduction bands.

Fitted parameters for wurtzite CdSe and CdS are presented in Data Table 2. The sign convention for cation-anion and anion-cation hopping parameters follows accepted conventions.

Strain dependence is included by adding the bond-stretching and bending dependence into tight-binding parameters, and fitting to DFT-derived valence and conduction band deformation potentials (FIG. 11). The strain-dependence parameters are summarized in Data Table 3.

Nanocrystals are cut out from bulk wurtzite CdSe and CdS, using a 4 nm core and 10 nm total diameter. For the disk-shaped nanocrystals, the core is shifted off-center by 2 nm and then 1 nm of CdS shell is shaved off on each side along the c-axis. Then the structure is relaxed (FIG. 12*a*) using the valence force field method, using the elastic constants from Data Table 3.

Figure 12A:
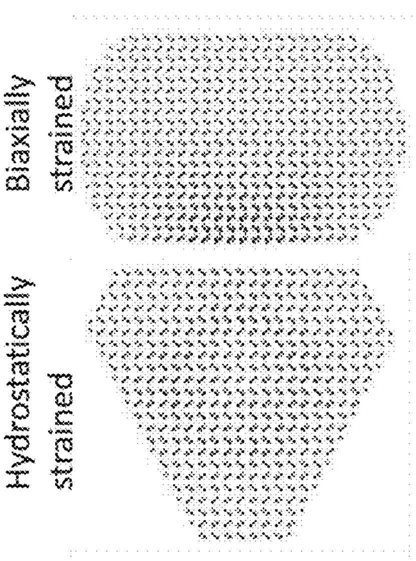
FIGS. 12*a-d* show simulated exciton fine structures in hydrostatically and biaxially strained QDs.
Figure 12B:
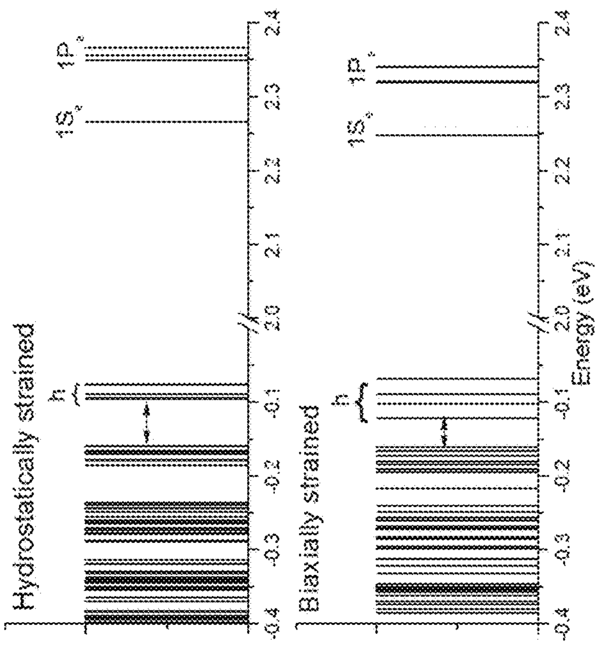

Similar to the case for core-only nanocrystals, single-particle bandedge hole states consist of a 4-holes nearly degenerate manifold (with spin degeneracy for each level), separated from the rest of the states by a small gap (FIG. 12*b*). This manifold is split by 20 meV in the hydrostatically strained QD and by 55 meV in a biaxially strained QD.

Among these 4 hole levels, two have an s-like envelope and two are p-like (FIG. 8*c*), resulting in two nominally bright and two dark transitions to the lowest lying 1S electron state, respectively, as confirmed by the computed dipole transition elements.

The exciton fine structure (FIG. 8*d*) is computed using the configuration interaction method, using the basis of 4 (×2 for spin-degeneracy) electrons and 8 (×2) holes. The intensity of optical transitions between the obtained states is calculated based on the computed dipole transition elements.

Binding Energy of Different Ligands on Different Facets

Ligand binding energies are computed within DFT, using CP2K computational package. Goedecker-Tetter-Hutter pseudopotentials with MOLOPT basis sets (possessing low basis set superposition errors) and a 300 Ry grid cut off were used. The ligands were placed on the Cd-rich and Se-rich (0001) facets of a Cd-rich 1.5 nm CdSe nanocrystal in a (30 A)$^3$ unit cell, the rest of the dangling bonds being fully saturated with carboxylate and amine ligands to ensure the charge neutrality condition. Desorption energies are reported relative to fully relaxed with no constraints structures and unprotonated anionic ligands (within a spin-polarized calculation) without the inclusion of solvent effects.

Analytical Gain Threshold Model

An effective degeneracy factor of the bandedge hole states was introduced as follows:

$$g_h=2\Sigma\exp(-\Delta E/kT),$$

where 2 accounts for spin degeneracy, ΔE is the distance of the level from the bandedge, and the sum is performed over 4 hole levels. In the limit of zero splitting it gives 8, while it is 2 in the case of large splitting.

The definition of the gain threshold in terms of quasi-Fermi level splitting overcoming the bandgap, can be approximately recast in terms of the bandedge state occupancy, $n_e$ and $n_h$:

$$n_e+n_h=1,$$

or $$N/g_e+N/g_h=1,$$

where $g_e$ and $g_h$ are effective degeneracies for electrons and holes, respectively, N is the number of e-h pairs per dot.

In the case of 2-fold spin degenerate band-edge states, $g_{e,h}=2$, thus gain is achieved at N=1.

For 8-fold degenerate holes states, gain threshold is $N=g_eg_h/(g_e+g_h)=2*8/(2+8)=1.6$ In ensemble, N=1.6 would mean that all dots should be populated with an exciton, and 0.6 of the dot population should contain one more exciton, i.e. 0.6 of the dot population contains biexcitons and the remaining 0.4 contains excitons. However, in reality it is impossible to populate the ensemble homogeneously, and some dots will contain more than two excitons while some would have no excitons at all, as described by Poisson distribution (FIG. 7*a*).

One can roughly estimate the effect of Poissonian statistics on the gain threshold by looking at what average occupancy <N> a similar ratio of emitting dots (biexcitons and multiexcitons) to absorbing dots (empty dots and dots with single-exciton) is achieved as in the homogeneous distribution. For N=1.6 the corresponding <N>≈2.3

Numerical Gain Threshold Model

To estimate the gain threshold more accurately, numerical gain threshold simulations were performed following the existing methodology and extending it to include the 8-fold degeneracy and inhomogeneous broadening of the levels (FIG. 7). Splitting of the levels is chosen according to the tight-binding results and experimental ensemble line broadening is taken. The resulting excitons are populated according to Boltzman statistics. Dark and bright optical transitions are distinguished only based on the spin-selection rules and all the bright optical transitions are considered to have the same oscillator strength. Zero biexciton binding energies are assumed.

For a given average occupancy <N> a true Poissonian distribution is taken into account as obtained from Monte-Carlo simulations (FIG. 7*a*). Multiexcitons are assumed to have the same emission spectrum as biexcitons but no absorption, since the 1S electron state is fully bleached.

The model predicts <N>=1.15 threshold for single-electron and hole levels (twofold spin-degenerate each) (FIG. 7*c*). For eightfold degenerate holes the model indicated <N>=2.7 with 20 meV splitting and 95 meV linewidth, while splitting the levels by 55 meV reduces the threshold to <N>=2.2.

FIGS. 7*a-d* show numerical simulations. FIG. 7*a* shows Poisson distribution of single-exciton (X), biexciton (XX) and multiple excitons in CQDs ensemble with different average exciton occupations <N>. FIG. 7*b* shows competition between stimulated emission (dark area above zero line) and absorption (dark area below zero line) at <N>=2.5 excitons ensemble population for ensembles. Hydrostatically strained (has not reached the gain threshold) and biaxially strained (surpassed the gain threshold) quantum dots. Grey indicates absorption at zero state filling. The dark area above zero line indicates absorption of populated dots ensemble The dark area below zero line shows stimulated emission. FIG. 7*c* shows numerical simulation of absorption bleaching and gain vs. exciton occupancy for different hole degeneracies, splitting values and linewidths. FIG. 7*d* shows numerical simulation showing the dependence of excitation power required to maintain the given occupancy in CW regime. A 1.4× gain threshold reduction in terms of excitonic occupancy reduces the required power~2× in CW.

FIGS. 8*a-c* show sizes and exciton decay dynamics of singly- and doubly-shelled CQDs. FIG. 8*a* shows bright field TEM and HRTEM characterizations of singly-shelled asymmetric CQDs. TEM images unveil the hemisphere shape of asymmetric CQDs, which directly confirms that only (0001) facet growth has been blocked by oleylamine when TOPS was used as sulfur precursor. FIG. 8*b* shows bright-field TEM and HRTEM characterizations of doubly-shelled asymmetric CQDs. To get an overall morphology characterization, doubly-shelled CQDs were deposited on lacey carbon TEM grids with holes to observe CQDs with different orientations. A thorough analysis reveals that these CQDs show hexagonal disc-like shape with two flat faces: viewing from [0002] zone axis, they show hexagonal or triangular shape; observing along [$12\bar{3}0$], they show rectangular shape with two curved sides. FIG. 8*c* shows single- and multiple-exciton lifetimes of asymmetric CQDs with single and double shell. After second uniform shell growth, the fast non-radiative trap recombination has been eliminated, resulting in significantly lengthened single-exciton lifetime (left) and increased PLQY. The multi-exciton dynamics (right) were investigated by ultra-fast TA spectroscopy. To achieve same exciton population, only CdSe cores were photoexcited (2.18 eV, 570 nm, 507 $\mu J/cm^2$). Due to improved passivation, the amplitude of the slower decay ($t_2$), which can be attributed to trion Auger recombination, decreases notably in doubly shelled asymmetric CQDs, indicating photoionization has been partially suppressed. As a result, more excitons were retained in doubly shelled CQDs within the whole time regime investigated (0-8 ns).

FIGS. 9*a-d* show full absorbance spectra and absorption cross section measurements. FIGS. 9*a-b* show absorbance spectra. FIGS. 9*c-d* show absorption cross sections. Details about absorption cross section measurement can be found in the characterization methods section.

FIGS. 10*a-j* show absorbance spectra, their second derivatives and PL spectra of CQDs with varying degrees of splitting. FIGS. 10*a-c* show samples referred as asymmetric CQD 1-3, see synthetic details in the method part. Sample referred to as asymmetric CQD 3 is the singly-shell CQDs mentioned above. FIGS. 10*e-j* show absorbance and PL spectra evolution during the first shell growth, whose resultant product is referred as asymmetric CQD 3. FIGS. 10*e-f* show that during first asymmetric shell growth, the first exciton peak gradually broadens and then splits into two peaks with increasing the reaction time, reaching a maximum splitting of 62 meV. At the same time, the bandedge exciton peak continuously red shifts as a result of increased electron wave function delocalization. The progressive splitting is more obvious in second derivative absorbance spectra. FIGS. 10*h-i* show the PL linewidths dramatically decrease after shell growth. PL peaks red shift as the bandedge exciton peaks shift.

FIGS. 11*a-h* show band structure simulations. FIG. 11*a* shows comparison of CdSe and CdS band structures computed with VASP and fitted with QNANO. FIG. 11*b* shows DFT-calculated dependences of band energies vs. strain. Tight-binding reproduces the behavior exactly.

Figure 12C:
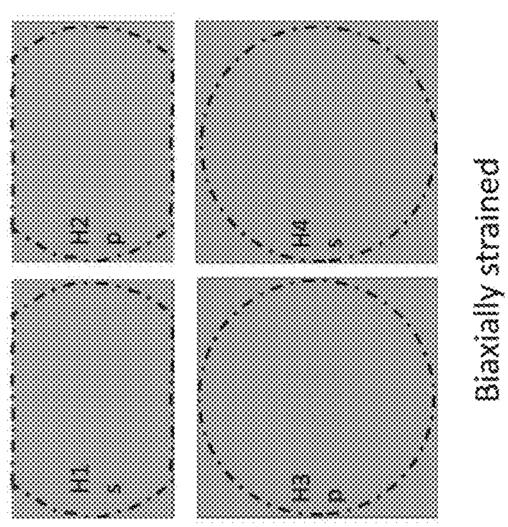
Figure 12D:
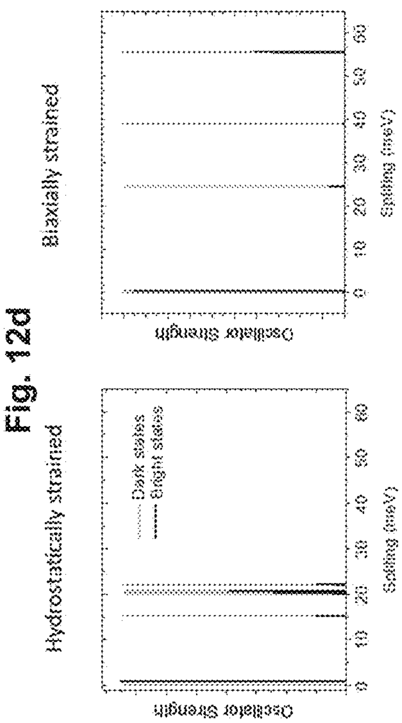

FIGS. 12*a-d* show simulated exciton fine structures in hydrostatically and biaxially strained CQDs. FIG. 12*a* shows core-shell structures following the strain relaxation procedure. FIG. 12*a* (left) shows tetrahedron-shaped, with 4 nm CdSe core exactly at the center, leading to hydrostatic strain. FIG. 12*a* (right) shows disk-shaped, with 4 nm CdSe off-centered by 2 nm, leading to biaxial strain. FIG. 12*b* shows single-particle states of hydrostatically and biaxially strained CdSe—CdSe core-shell quantum dots calculated with the tight-binding method. FIG. 12*c* shows wavefunctions of the topmost hole states in the biaxially strained CQDs. FIG. 12*d* shows exciton fine structures from tight-binding atomistic simulations. Dark and bright states originate from the same hh-el transition but with different spin configurations, i.e. both are based on heavy holes. Dark-bright splitting depends on the electron-hole exchange interaction which remains on the order of 1 meV in thick-shell dots and is not affected by the splitting between the heavy hole and light hole states, i.e. is insensitive to biaxial strain.

FIGS. 13*a-d* show temperature dependent PL decay. Hydrostatically (FIGS. 13*a-b*) and biaxially (FIGS. 13*c-d*) strained CQDs show very similar temperature dependence. The dark-bright states splitting results in slower PL decays at low temperature in shell-free dots. However, the trend in thick-shell dots is opposite due to efficient negative charging of the dots in the absence of molecular oxygen in the environment. Trion's lowest excitonic state is bright, resulting in faster PL decay at low temperature. The temperature dependent PL lifetime measurements show the above trend and exhibit no difference between the hydrostatically and biaxially strained dots. The insets show the TEM images of two types CQD.

Figures 14A, 14B, 14C, 14D:
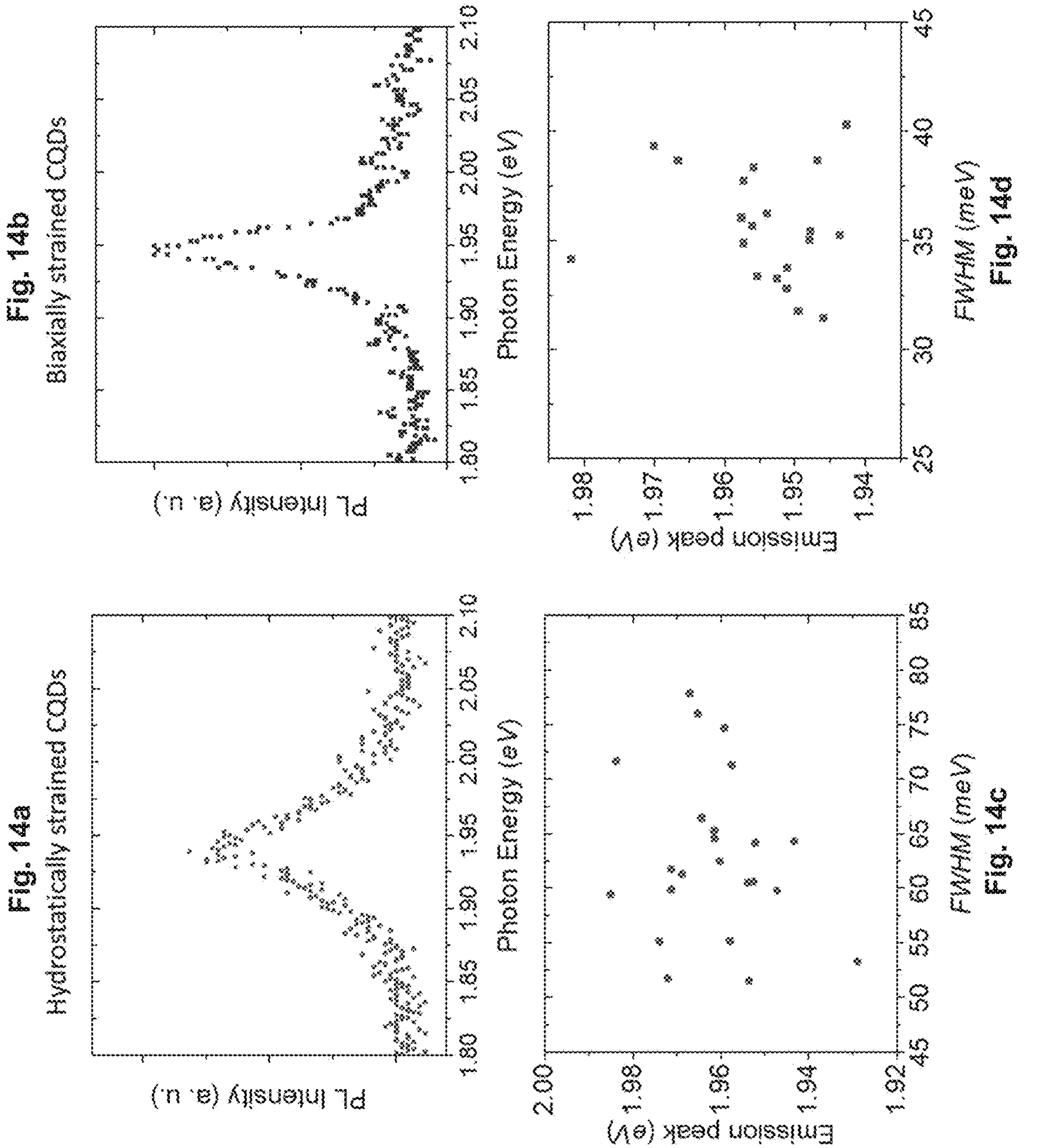
FIGS. 14*a-d* show single-dot PL linewidth data for QDs.

FIG. 14*a-d* show single-dot PL linewidth data. FIG. 14*a-b* show typical single-dot spectra of hydrostatically and biaxially strained CQDs, with FWHM of 60 and 32 meV, respectively. FIG. 14*cc* shows 24 hydrostatically strained CQDs show average PL linewidth of 63 meV and peak position of 1.96 eV, with standard deviations of 11.8 and 0.67%, respectively. FIG. 14*d* shows the average PL linewidth and peak position of 20 biaxially strained single-dot are 36 meV and 1.95 eV, with standard deviations of 7.2% and 0.5%, respectively.

Figure 15A:
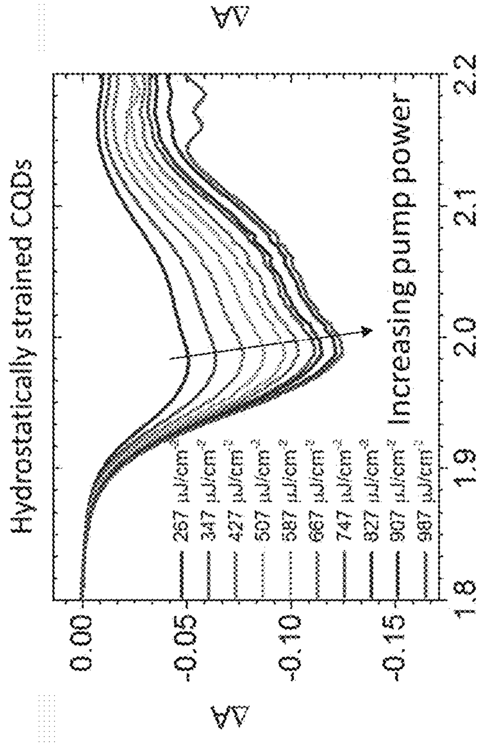
FIGS. 15*a-d* show optical gain threshold measurements for QDs.
Figure 15B:
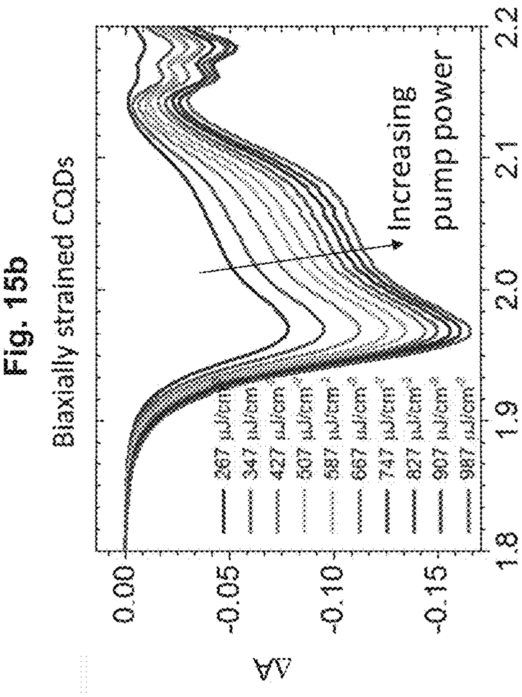
Figure 15C:
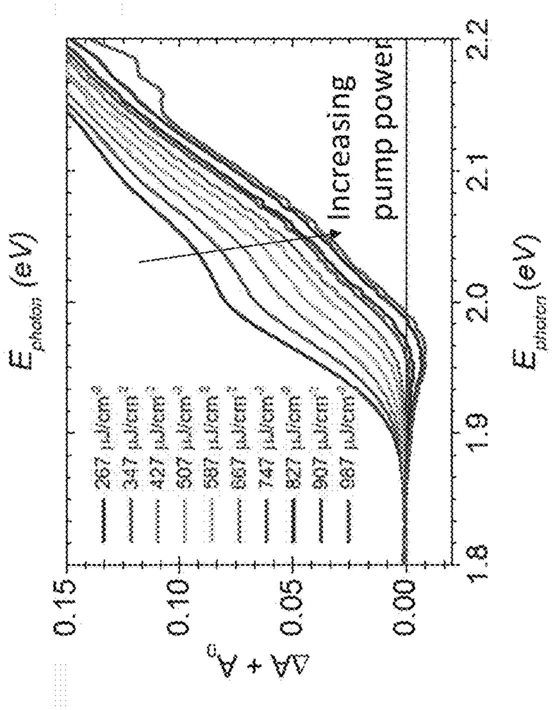
Figure 15D:
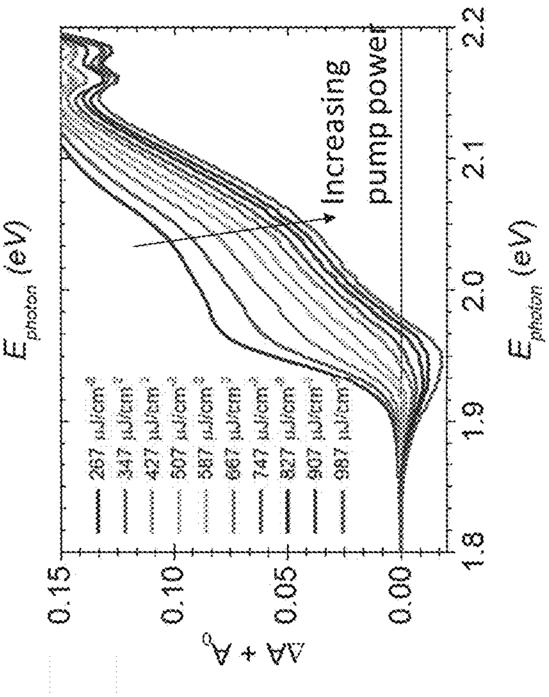

FIGS. 15*a-d* show optical gain threshold measurements. FIGS. 15*a, c* show delta A and delta $A+A_0$ of hydrostatically and FIGS. 15*b, d*, biaxially strained CQDs. The solution optical densities were carefully adjusted to 0.2 with 1 mm light path length to ensure they absorb the same number of photons. Photoexciting energy was selected as 2.18 eV (570 nm) to excite core absorption only to decouple the possible shell volume difference. The instantaneous total absorption was collected 27 ps after pulsed excitation, and this provides the sum of ground state absorption and bleaching. At a certain power, the absorption turns negative, giving evidence of optical gain. Due to gradual state filling, the maximum net gain peak continuously shifts to higher energies.

Figure 16A:
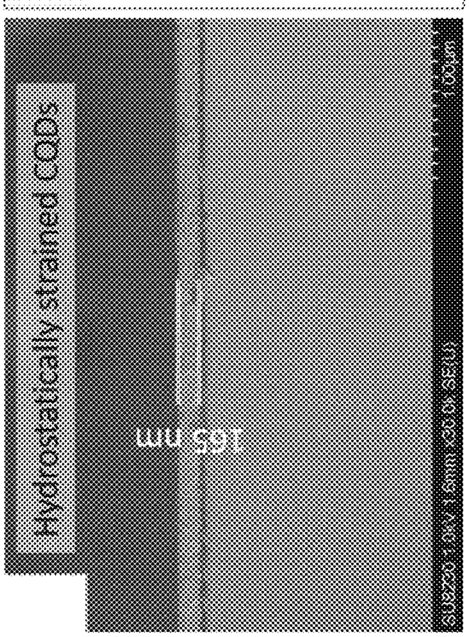
FIGS. 16*a-d* show SEM cross section and AFM images of hydrostatically and biaxially strained QD film samples.
Figure 16B:
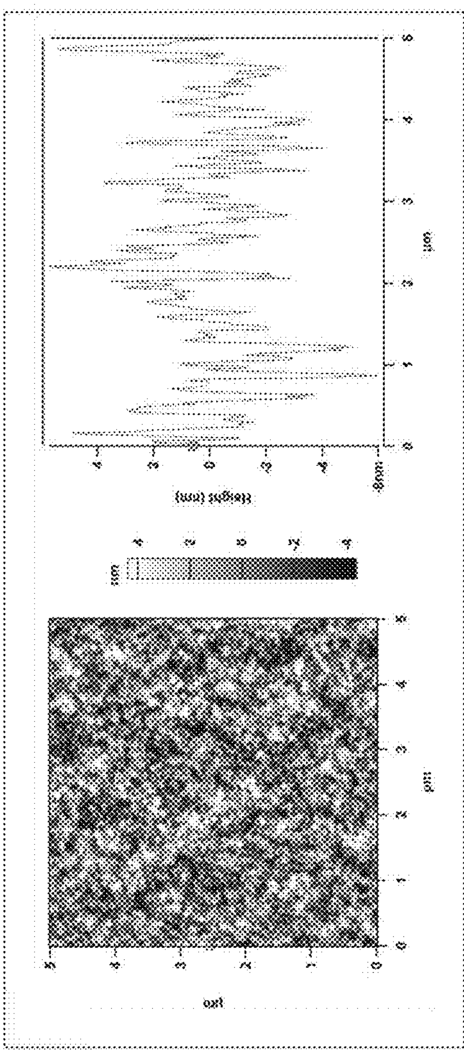
Figure 16C:
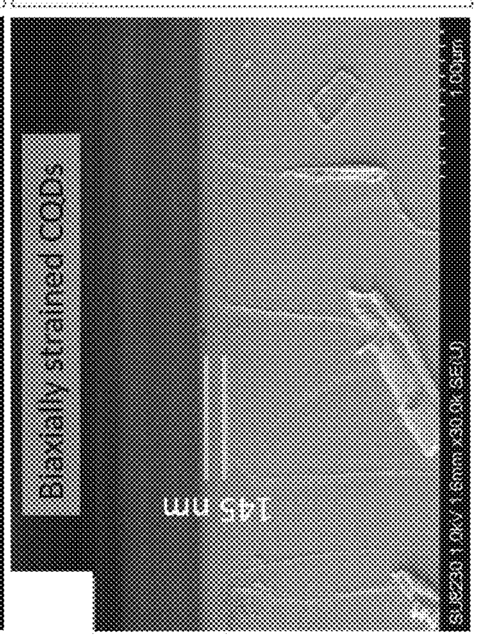
Figure 16D:
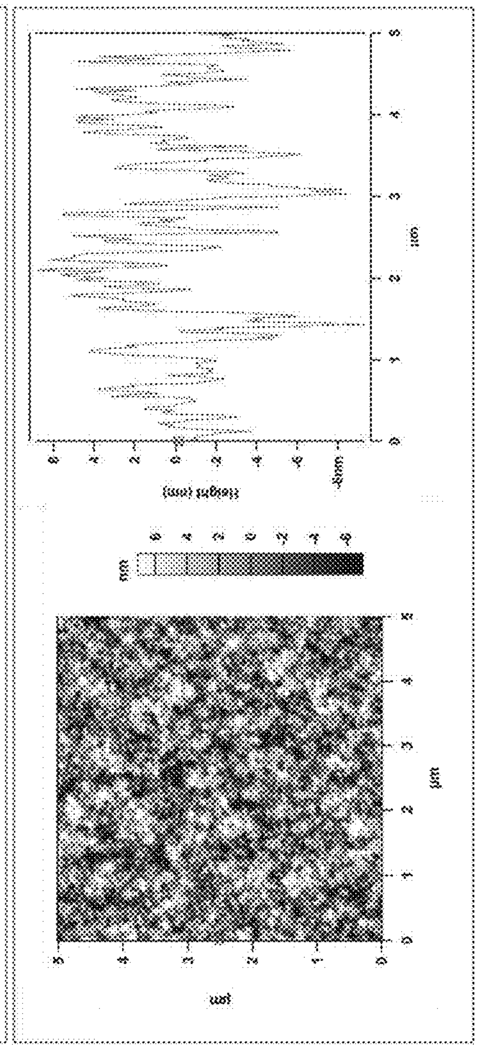

FIGS. 16*a-d* show SEM cross section and AFM images of hydrostatically and biaxially strained CQD film samples. FIG. 16*a* shows cross sectional SEM of hydrostatically strained CQD film, showing a thickness of 165 nm. FIG. 16*b* shows AFM image and height trace of hydrostatically strained CQDs. FIG. 16*c* shows cross sectional SEM of hydrostatically strained CQD film, showing a 145 nm film thickness. FIG. 16*d*, AFM image and height trace of biaxially strained CQDs.

Figures 17A, 17B, 17C, 17D, 17E, 17F:
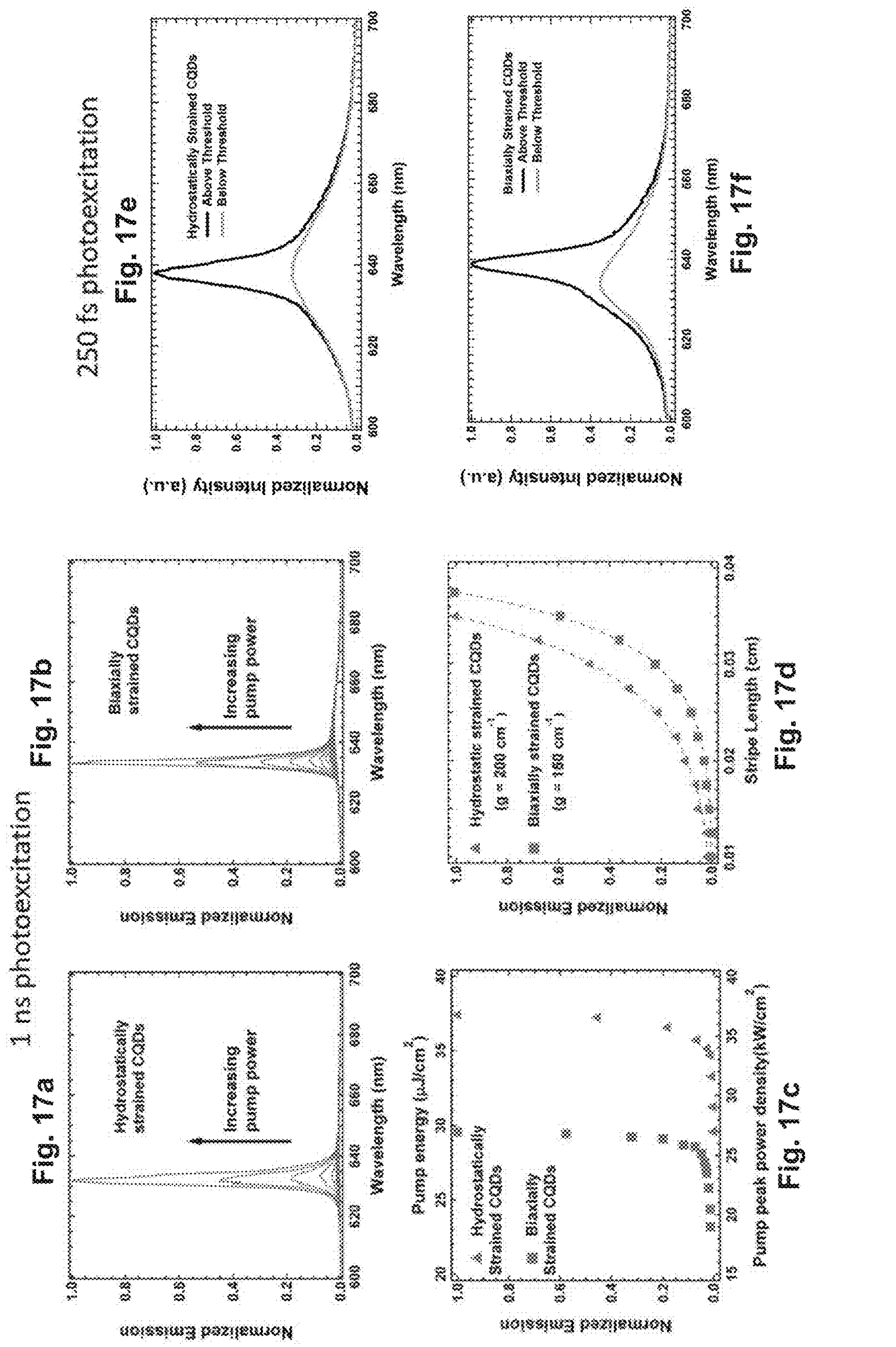
FIGS. 17*a-f* show ASE threshold and modal gain measurements of QDs films with 1 ns and 250 fs 3.49 eV (355 nm) photoexcitation.

FIGS. 17*a-f* show ASE threshold and modal gain measurements of CQDs films with 1 ns and 250 fs 3.49 eV (355 nm) photoexcitation. FIGS. 17*a-b* show spectra of hydrostatically and biaxially strained CQDs, respectively, with increasing photoexciting power, showing ASE peaks rising above the PL background. FIG. 17*c* shows emission as a function of photoexciting peak power density and pulse energy for both hydrostatically and biaxially strained CQDs. A 2 mm×10 μm stripe with 1 ns pulse duration was used. The ASE thresholds are 36 and 26 $\mu J/cm^2$ for hydrostatically and biaxially strained CQDs, respectively. FIG. 17*d* shows variable stripe length measurements for both hydrostatically and biaxially strained CQDs. Measurements were carried out using a photoexciting energy of four times the threshold value, obtained using a 2 mm×10 μm stripe. The gain values are 200 $cm^{-1}$ and 150 $cm^{-1}$ for hydrostatically and biaxially strained CQDs, respectively. The lower gain value from biaxially strained CQDs can be explained by the fact that fewer emission states are participating in the optical gain. FIGS. 17*c-d* show ASE threshold measurements of CQDs films with 250 fs 3.49 eV (355 nm) photoexcitation. Thresholds of 22 $\mu J/cm^2$ and 14 $\mu J/cm^2$ were determined from hydrostatically and biaxially strained CQD films used for measuring the 1 ns ASE threshold.

FIGS. 18*a-e* show single- and multiple-exciton lifetimes of hydrostatically and biaxially strained CQDs, respectively. FIG. 18*a* shows due to the similar total shell volume, both two types of core-shell CQDs show similar single-exciton lifetimes. FIG. 18*b* shows the multiple exciton decays with core only photoexcitation (2.18 eV, 570 nm, 507 $\mu J/cm^2$) can be fit as bi-exponential decays: in the fast decay regime, hydrostatically strained core-shell CQDs show slightly longer lifetime than the biaxially strained CQDs, but it turns to be the opposite in the slower decay regime. FIGS. 18*c-d* shows multiple exciton decays under different photoexcitation intensities. The bleach signals time traces of hydrostatically strained and biaxially strained CQDs show clear dependence upon photoexcitation power, confirming the Auger recombination is the main decay path.

Figure 19A:
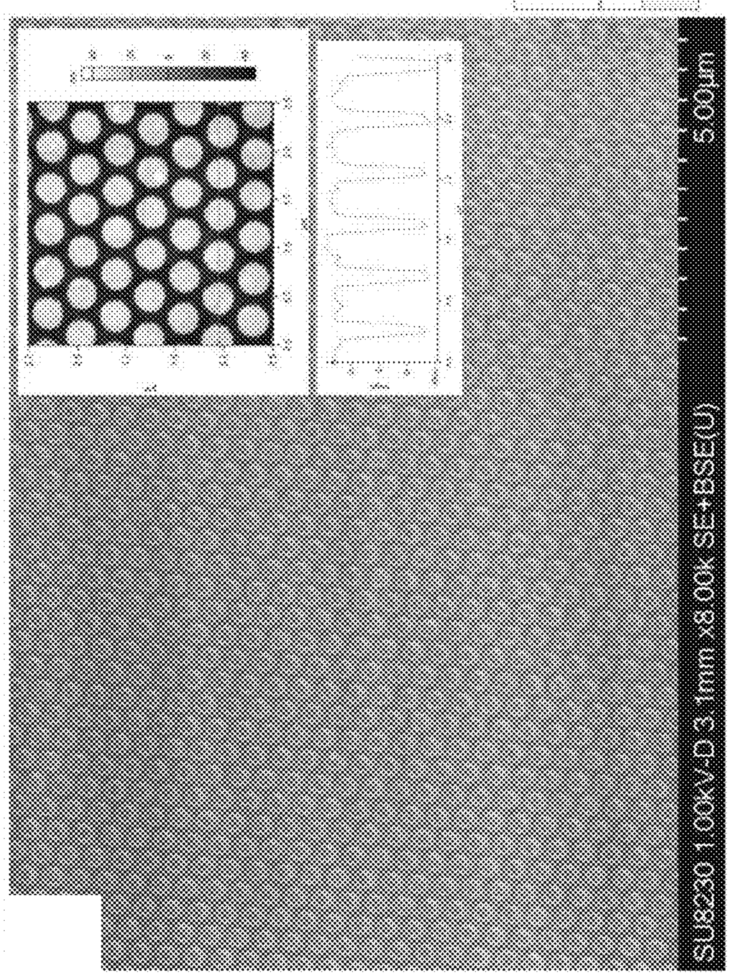
FIGS. 19*a-b* show PC-DFB substrate and $Cl^-$ exchanged QDs for CW lasing.
Figure 19B:
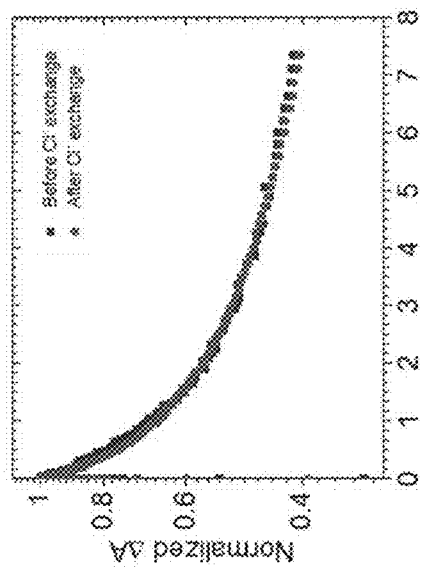

FIGS. 19*a-b* show PC-DFB substrate and $Cl^-$ exchanged CQDs for CW lasing. FIG. 19*a* shows AFM image of PC-DFB device, showing $MgF_2$ pillars on top of a single crystal $MgF_2$ substrate. The y-axis has been shifted to make the pillar height relative to the substrate surface at 0 nm. Dark lines are scratches inherent in the substrate. The insets show Height trace of ~60 nm pillars in grating. FIG. 19*b* shows multiple exciton lifetimes of biaxially strained CQDs before and after $Cl^-$ exchange. The multiple exciton decays before and after Cl— exchange are quite similar under the same photoexcitation condition (2.18 eV, 570 nm, 427 $\mu J/cm^2$).

FIGS. 20*a-g* show another CW PC-DFB CQD laser with threshold of 6.4 $kW/cm^2$. FIG. 20*a* shows normalized emission as a function of power when optically photoexcited at 442 nm with CW laser. FIG. 20*b* shows spectra at varying pump powers. FIG. 20*c* shows normalized emission as a function of peak power and time. By applying a delay to the spectrometer acquisition, the spectra of the last ten microseconds of the pulse were measured, showing a lasing peak when above threshold: FIG. 20*c* shows emission spectra at powers above and below threshold for 50 ms pulses and 10 Hz repetition rate, constituting a 50% duty cycle. FIG. 20*d* shows emission spectra at powers above and below threshold for 75 ms pulses and 10 Hz repetition rate, constituting a 75% duty cycle. FIG. 20*f* shows HeNe laser (633 nm) signal with electrical interference induced by AOM driver in the photodiode signal with AC coupling (measured HeNe laser signal is continuous wave with steady output). FIG. 20*g* shows electrical signal in photodiode with no input radiation, showing electrical interference. The oscillation (102 Hz) in both these traces and in lasing experiments are consistent, and are caused by electrical interference, rather than changes in intensity.

DATA TABLE 1

DFT ligand binding energies on different CdSe facets.

| Binding energy (eV) | TOPS | Amine | Thiol |
|---|---|---|---|
| Cd(0001) | 0 | 0.5 | 2.8 |
| Se(000$\bar{1}$) + Cd adatoms | 0.5 | 0.5 | 3 |

DATA TABLE 2

Anion-cation tight-binding parameters.

| Parameter | CdSe Energy (eV) | CdS Energy (eV) |
|---|---|---|
| E_s | −10.1317 | −6.23428 |
| E_p | 1.276342 | 1.135807 |
| E_pz | 1.276342 | 1.121149 |
| E_sstar | 13.62648 | 20.88163 |
| E_d | 11.34584 | 17.51518 |
| Delta_so | 0.129204 | 0.002057 |
| T_ss | −1.4044 | −0.71627 |
| T_sp | 1.762816 | 3.388472 |
| T_ps | 2.020405 | 2.21119 |
| T_pp_sigma | 3.173072 | 3.200368 |
| T_pp_pi | −0.95224 | −0.94448 |
| T_ssstar | −1.29E−07 | −3.03092 |
| T_sstars | −0.95964 | −0.18043 |
| T_psstar | 1.571215 | 2.08E−08 |
| T_sstarp | 8.44E−07 | 0.001228 |
| T_sstarsstar | −2.2149 | −3.05422 |
| T_sd | −2.10576 | −3.24816 |
| T_ds | −0.90256 | −2.52E−07 |
| T_pd_sigma | −1.01023 | −0.83772 |
| T_dp_sigma | −0.09093 | −0.03209 |
| T_pd_pi | 1.248753 | 1.364136 |
| T_dp_pi | 1.496253 | 2.215964 |
| T_sstard | −2.37E−08 | −5.64918 |
| T_dsstar | −1.24755 | −1.75E−07 |
| T_dd_sigma | −2.35778 | −5.50253 |
| T_dd_pi | 1.187982 | 1.751654 |
| T_dd_delta | −0.27706 | −0.53542 |

DATA TABLE 3

Elastic constants and tight binding strain parameters.

| Parameter | CdSe | CdS |
|---|---|---|
| lattice_constant_a | 4.29328 A | 4.11147 A |
| lattice_constant_c | 7.0109 A | 6.714 A |
| c11 | 7.49 | 8.432 |
| c12 | 4.609 | 5.212 |
| c44 | 1.315 | 1.489 |
| Alpha (bond stretching) | 41.2 | 41.2 |
| Beta (bond bending) | 8.6628 | 8.6628 |

DATA TABLE 3-continued

Elastic constants and tight binding strain parameters.

| Parameter | CdSe | CdS |
|---|---|---|
| N__ss | 0.986677 | 2.64E−08 |
| N__sp | 4.46861 | 3.216914 |
| N__ps | 4.46861 | 3.216914 |
| N__pp__sigma | 5.918332 | 5.96633 |
| N__pp__pi | 1.516334 | 7.294005 |
| N__ssstar | 0 | 0 |
| N__sstars | 0 | 0 |
| N__psstar | 3.467124 | 11.36469 |
| N__sstarp | 3.467124 | 11.36469 |
| N__sstarsstar | 0 | 0 |
| N__sd | 6.217625 | 12.60006 |
| N__ds | 6.217625 | 12.60006 |
| N__pd__sigma | 1.501326 | 4.233841 |
| N__dp__sigma | 1.501326 | 4.233841 |
| N__pd__pi | 0.019994 | 2.133435 |
| N__dp__pi | 0.019994 | 2.133435 |
| N__sstard | 2 | 2 |
| N__dsstar | 2 | 2 |
| N__dd__sigma | 2 | 2 |
| N__dd__pi | 2 | 2 |
| N__dd__delta | 2 | 2 |
| E__strain__shift | 27 | 27.2 |
| C__diag | 1 | 1 |
| C__ss | 4.75344 | 0.632891 |
| C__sp | 26.16554 | 30.97355 |
| C__ps | 0.000164 | 2.549964 |
| C__pp | 3.537953 | 1.147709 |
| C__ssstar | 0 | 0 |
| C__sstars | 0 | 0 |
| C__psstar | 1.30E−05 | 0.060369 |
| C__sstarp | 0.564188 | 0.861457 |
| C__sstarsstar | 0 | 0 |
| C__sd | 6.26E−05 | 0.612809 |
| C__ds | 0.000207 | 0.994687 |
| C__pd | 3.06969 | 5.91E−08 |
| C__dp | 47.69949 | 1.57E−08 |
| C__sstard | 0.470071 | 0.922341 |
| C__dsstar | 6.01E−05 | 0.418623 |
| C__dd | 7.04E−05 | 3.94E−08 |

DATA TABLE 4

Lowest steady state ASE or lasing thresholds from nanoplatelets and CQD.

| Materials | fs ASE threshold ($\mu J/cm^2$) | Biexciton/ gain lifetime (ps) | Extrapolated CW ASE threshold based on fs threshold and gain lifetime ($kW/cm^2$) | Reported CW or quasi-CW ASE/lasing threshold ($kW/cm^2$) |
|---|---|---|---|---|
| Nanoplatelets | 6 | 124 | 48 | 0.006 (CW ASE) |
| Nanoplatelets | 7.1 | 160 | 44 | 100 (10 ns ASE) |
| First microsecond lasing QDs | 29 | 700 | 41 | 50 (1 μs lasing) |
| Biaxially strained QDs | 14 | 580 | 21 | 6.4 (CW lasing) |
| This specification | | | | |

The above-described implementations are intended to be exemplary and alterations and modifications may be effected thereto, by those of skill in the art, without departing from the scope of the invention which is defined solely by the claims appended hereto.

We claim:

1. A quantum dot comprising:

a core comprising a semiconductor;

a shell substantially covering the core;

the core having a first side and a second side opposite the first side, the core disposed eccentrically inside the shell such that the shell is thinnest at the first side and thickest at the second side, the shell having a thickness of greater than or equal to zero at the first side; and the core and the shell having different respective lattice constants such that the shell exerts a straining force on the core, the straining force configured to modify an excitonic fine structure of the core such that a first excitonic absorption peak associated with the quantum dot is split into a first modified peak having a first peak energy and a second modified peak having a second peak energy, wherein the first peak energy is separated from the second peak energy by more than a thermal energy at room temperature; and wherein a first number of excitonic transitions corresponding to the first modified peak is reduced compared to a second number of excitonic transitions corresponding to the first excitonic absorption peak.

2. The quantum dot of claim 1, wherein the core comprises CdSe and the shell comprises CdS.

3. The quantum dot of claim 1, wherein the core comprises a wurtzite crystal structure and the first side comprises a (0001) facet of the wurtzite crystal structure.

4. The quantum dot of claim 1, wherein a thickness of the shell is less than about 1 nm at the first side.

5. The quantum dot of claim 1, wherein the straining force comprises a biaxial force compressing the core in directions perpendicular to an axis running through the first side and the second side.

6. The quantum dot of claim 1, wherein the shell is substantially six-fold symmetrical about an axis running through the first side and the second side.

7. The quantum dot of claim 1, wherein a thickness of the shell is non-decreasing when moving along a surface of the core from the first side towards the second side.

8. The quantum dot of claim 1, wherein the splitting the first excitonic absorption peak comprises a reduction of an optical gain threshold of the quantum dot by at least about 1.1 times.

9. The quantum dot of claim 1, wherein a photoluminescence linewidth of the quantum dot is smaller than 40 meV.

10. The quantum dot of claim 1, further comprising an additional shell having a substantially uniform thickness and configured to passivate the quantum dot to increase a photoluminescence quantum yield of the quantum dot.

11. The quantum dot of claim 10, wherein the additional shell comprises any one of CdS, ZnSe, and ZnS.

12. The quantum dot of claim 1, wherein the quantum dot is a colloidal quantum dot.

13. A method of synthesizing core-shell quantum dots, the method comprising:

providing cores comprising CdSe particles dispersed in a liquid medium;

mixing the cores with octadecene and oleylamine to form a reaction mixture;

selectively removing the liquid medium from the reaction mixture;

heating the reaction mixture to a range of about 280° C. to about 320° C.; and adding to the reaction mixture Cd-oleate and tri-octylphosphine sulphide to form a CdS shell on the cores.

14. The method of claim 13, wherein the Cd-oleate and the tri-octylphosphine sulphide are added simultaneously and continuously to the reaction mixture.

15. The method of claim 13, further comprising growing an additional CdS shell on the core-shell quantum dots, the growing the additional CdS shell comprising:

heating to a range of about 280° C. to about 320° C. another reaction mixture comprising the core-shell quantum dots; and after the heating, adding further Cd-oleate and octanethiol to the other reaction mixture as precursors for forming the additional CdS shell.

16. The method of claim 15, wherein the further Cd-oleate and the octanethiol are diluted in octadecene; and the further Cd-oleate and the octanethiol are added simultaneously and continuously to the other reaction mixture.

17. The method of claim 15, further comprising adding further oleylamine to the other reaction mixture, the further oleylamine configured to increase a dispersibility of the core-shell quantum dots.

18. A laser comprising:

an optical feedback structure; and a light emitter in optical communication with the optical feedback structure, the light emitter comprising the quantum dot of claim 1, the modifying the excitonic fine structure of the core configured to reduce a gain threshold to facilitate lasing;

wherein the laser is a continuous wave laser.

* * * * *